United States Patent
Aotake et al.

(10) Patent No.: US 10,749,116 B1
(45) Date of Patent: Aug. 18, 2020

(54) DIBENZOPYRROMETHENE BORON CHELATE COMPOUND, NEAR-INFRARED LIGHT-ABSORBING MATERIAL, THIN-FILM, AND ORGANIC ELECTRONIC DEVICE

(71) Applicant: Nippon Kayaku Kabushiki Kaisha, Tokyo (JP)

(72) Inventors: Tatsuya Aotake, Tokyo (JP); Shoji Shinamura, Tokyo (JP); Kentaro Maeda, Tokyo (JP); Yuta Hashimoto, Tokyo (JP); Yuichi Sadamitsu, Tokyo (JP)

(73) Assignee: Nippon Kayaku Kabushiki Kaisha, Tokyo (JP)

( * ) Notice: Subject to any disclaimer, the term of this patent is extended or adjusted under 35 U.S.C. 154(b) by 0 days.

(21) Appl. No.: 16/637,064

(22) PCT Filed: Aug. 6, 2018

(86) PCT No.: PCT/JP2018/029435
§ 371 (c)(1),
(2) Date: Feb. 6, 2020

(87) PCT Pub. No.: WO2019/031456
PCT Pub. Date: Feb. 14, 2019

(30) Foreign Application Priority Data

Aug. 10, 2017 (JP) .................................. 2017-154882

(51) Int. Cl.
*H01L 51/42* (2006.01)
*C07F 5/02* (2006.01)
*H01L 51/50* (2006.01)
*H01L 51/00* (2006.01)

(52) U.S. Cl.
CPC .......... *H01L 51/0068* (2013.01); *C07F 5/022* (2013.01); *H01L 51/0072* (2013.01); *H01L 51/42* (2013.01)

(58) Field of Classification Search
None
See application file for complete search history.

(56) References Cited

U.S. PATENT DOCUMENTS

2019/0270758 A1   9/2019   Inouchi et al.

FOREIGN PATENT DOCUMENTS

| JP | 11255774 A | 9/1999 |
|----|------------|--------|
| JP | 2012199541 A | 10/2012 |
| JP | 2016166284 A | 9/2016 |
| JP | 2017137264 A | 8/2017 |
| WO | 2013035303 A1 | 3/2013 |
| WO | 2018079653 A1 | 3/2018 |

OTHER PUBLICATIONS

Lu et al., Structural modification strategies for the rational design of red/NIR region BODIPYs, Chemical Society Reviews, Jul. 7, 2014.
Loudet and Burgess, BODIPY Dyes and Their Derivatives: Syntheses and Spectroscopic Properties, Chemical Reviews, 2007, vol. 107, No. 11.

*Primary Examiner* — Kamal A Saeed
(74) *Attorney, Agent, or Firm* — The Webb Law Firm

(57) ABSTRACT

A compound is represented by the formula, $R_1$ to $R_8$ are each a hydrogen atom, aliphatic hydrocarbon group, aromatic group, heterocyclic group, a halogen atom, or the like. One of $X_1$ to $X_3$ is a sulfur atom, and the remaining two are carbon atoms having one $R_0$. One of $X_4$ to $X_6$ is a sulfur atom, and the other two are carbon atoms having one $R_0$. $R_0$ is a hydrogen atom, aliphatic hydrocarbon group, aromatic group, heterocyclic group, a halogen atom, or the like. When $X_1$ and $X_2$ are each $R_0C$, $X_2$ and $X_3$ are each $R_0C$, $X_4$ and $X_5$ are each $R_0C$, or $X_5$ and $X_6$ are each $R_0C$, the adjacent $R_0$s may be bounded to each other to form a cyclic structure.

11 Claims, 5 Drawing Sheets

[Figure 1]
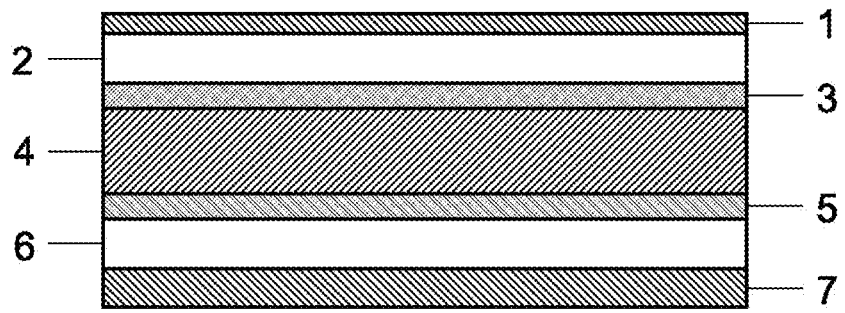
[Figure 2]
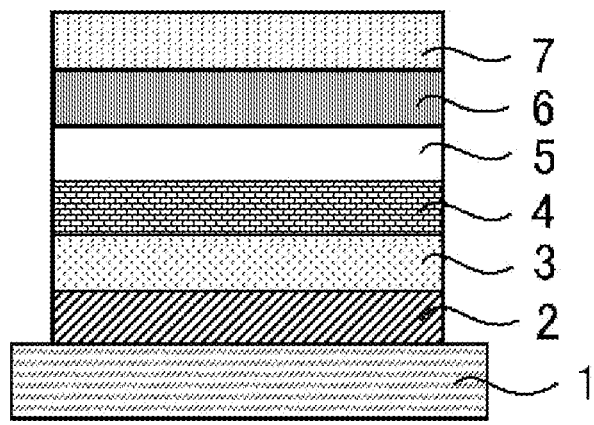
[Figure 3]
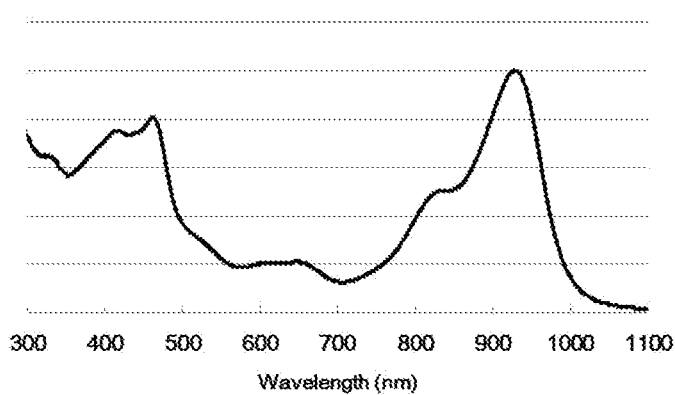

[Figure 4]
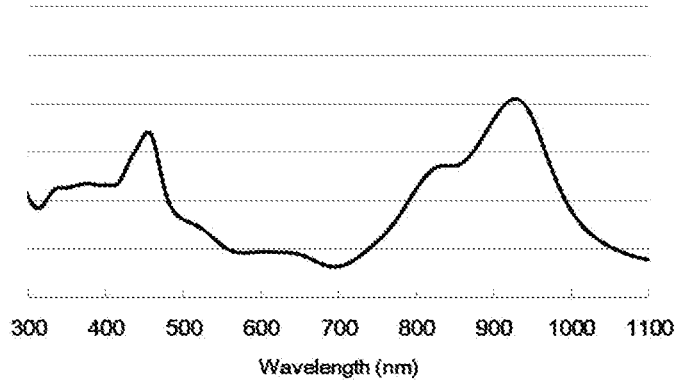
[Figure 5]
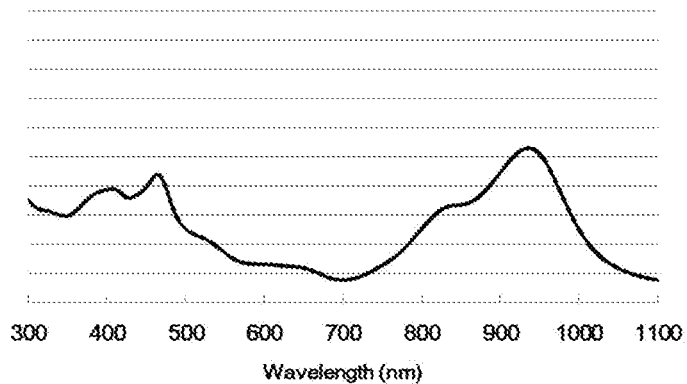
[Figure 6]
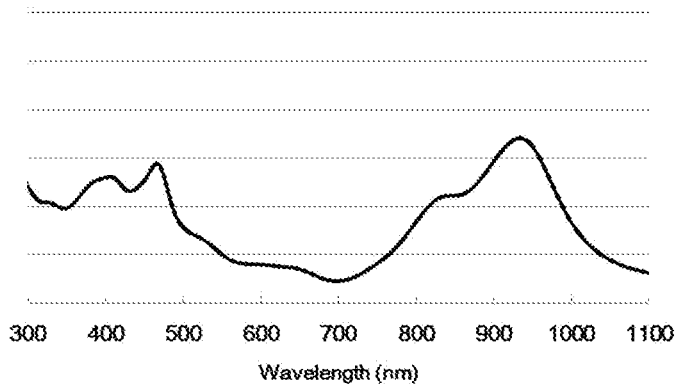

[Figure 7]
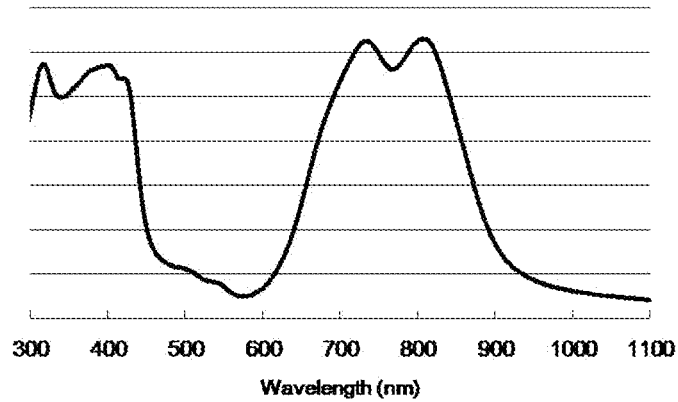
[Figure 8]
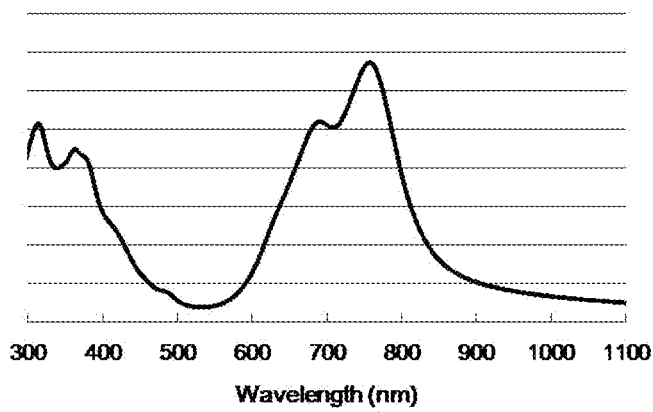
[Figure 9]
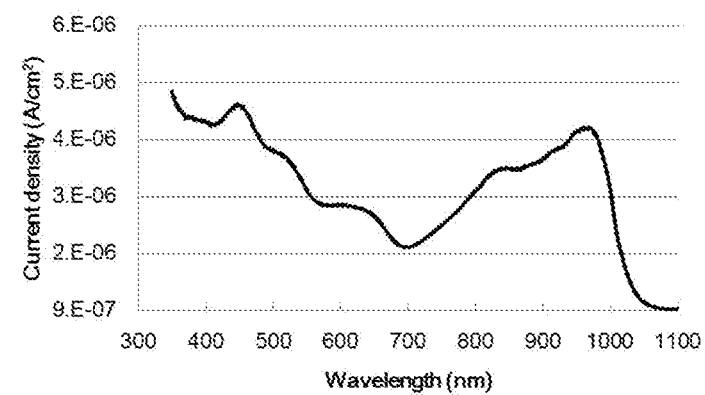

[Figure 10]
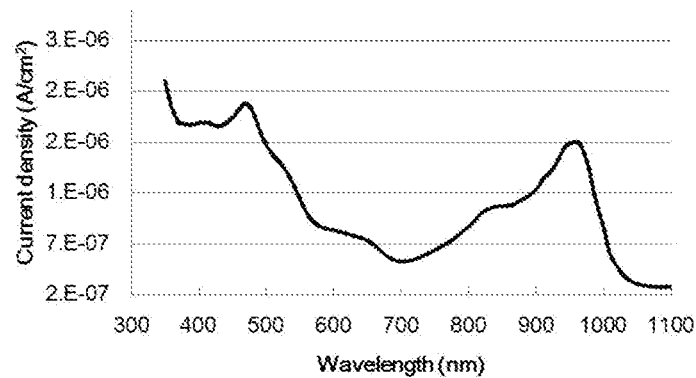
[Figure 11]
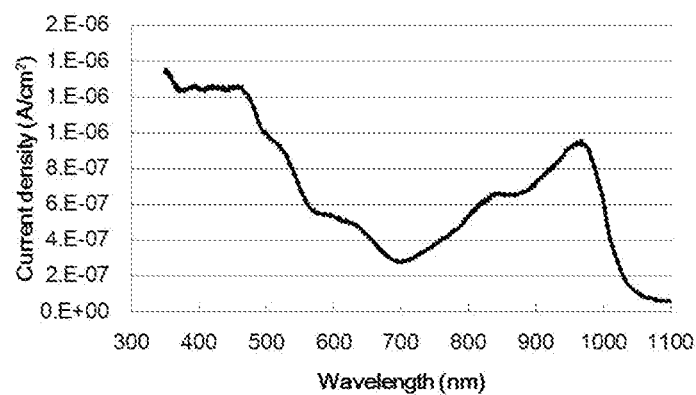
[Figure 12]
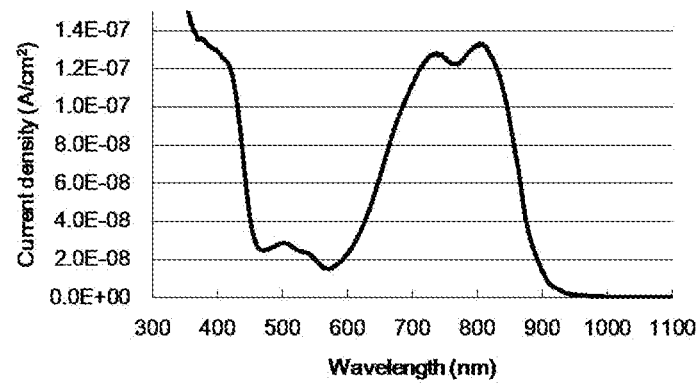

[Figure 13]
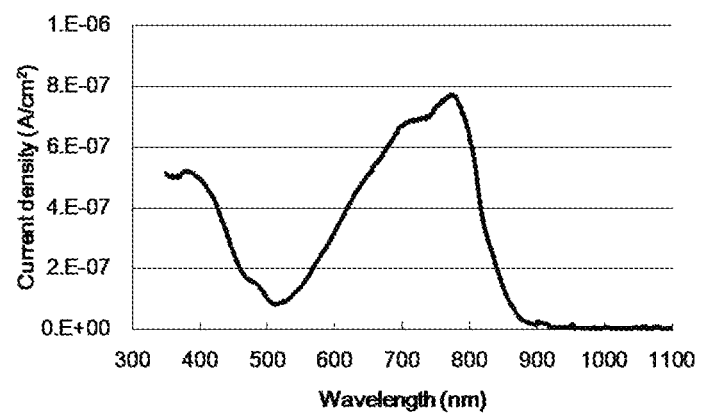

DIBENZOPYRROMETHENE BORON CHELATE COMPOUND, NEAR-INFRARED LIGHT-ABSORBING MATERIAL, THIN-FILM, AND ORGANIC ELECTRONIC DEVICE

CROSS-REFERENCE TO RELATED APPLICATIONS

This application is the United States national phase of International Application No. PCT/JP2018/029435 filed Aug. 6, 2018, and claims priority to Japanese Patent Application No. 2017-154882 filed Aug. 10, 2017, the disclosures of which are hereby incorporated by reference in their entirety.

BACKGROUND OF THE INVENTION

Field of the Invention

The present invention relates to a dibenzopyrromethene boron chelate compound having an absorption band in a near-infrared light region, and a near-infrared light absorbing material comprising the compound, a thin film, and an organic electronics device.

Description of Background Art

A near-infrared light absorbing material having an absorption band in the wavelength region of 700 to 2500 nm has been studied for various industrial applications. As a specific application thereof, examples include optical information recording media such as CD-R (Compact Disk-Recordable); printing applications such as thermal CTP (Computer To Plate), flash toner fixing and laser heat-sensitive recording; heat block film, etc. By utilizing the advantage of the properties in which light in a specific wavelength is selectively absorbed, the near-infrared light absorbing material is also used in near-infrared light cut filter used in PDP (Plasma Display Panel) filters, plant growth adjustment films, etc. Furthermore, the near-infrared light absorbing material can be used as a near-infrared light absorbing ink by dissolving or dispersing a dye containing the near-infrared light absorbing material in a solvent. Because the printed matter using the near-infrared light absorbing ink can be read only by a near-infrared light detector or the like, and is difficult to be visually recognized (invisible image), the near-infrared light absorbing ink is used for printing for the purpose of preventing counterfeiting, etc.

As such infrared light absorbing materials for formation of an invisible image, inorganic infrared light absorbing materials and organic infrared light absorbing materials are known. Among them, examples of the inorganic infrared light absorbing materials include rare earth metals such as ytterbium, copper phosphate crystallized glass, etc. However, because these inorganic infrared light absorbing materials do not have the sufficient light absorbing properties in the near-infrared region, a large amount of the infrared light absorbing material per unit area is required to form an invisible image. Therefore, when a visible image is further formed on the formed invisible image, a surface unevenness of the underlying invisible image may affect the surface state of the visible image.

On the other hand, because the organic infrared light absorbing material has the sufficient light absorbing properties in the near-infrared region, the amount of the infrared absorbing material used per unit area required for formation of an invisible image is relatively small. Therefore, if the organic infrared absorbing material is used, the inconvenience which occurs in the case of using the inorganic infrared light absorbing material will not occur. Therefore, the development of many organic near-infrared light absorbing materials has proceeded to the present day.

Incidentally, the organic electronics devices have been attracted in recent years, not only because the organic electronics device contains no rare metal as a raw material and can be supplied stably, but also because the organic electronics device has flexibility which is not found in inorganic materials and can be manufactured by a wet film formation method. Specific examples of the organic electronics device include an organic EL element, an organic solar cell element, an organic photoelectric conversion element, and an organic transistor element.

Further, applications utilizing the specific features of the organic materials are studied.

Among the organic electronics devices, the organic solar cell element and the organic photoelectric conversion element have been studied mainly on the absorption properties in the visible light region. At present, the coexistence of the improvement of the photoelectric conversion efficiency and the suppression of dark current value provided from the bulk hetero junction structure are studied. In addition to further improvement in performance, the absorption properties in the near-infrared region begin to attract attention for the development of new applications such as security and bioimaging applications. However, the development of the application of a light absorbing dye in a near-infrared region to an organic solar cell element and a photoelectric conversion element has only just started, and many developments are reported. For example, in Patent Literature 1, although the study aiming at applying the existing pigment dyes such as squarylium, which is one of the infrared rays absorbing materials mentioned above, to the photoelectric conversion materials in a near-infrared region is studied, however the organic electronics material using squarylium is not fastness and practical.

Non-Patent Literatures 1 and 2 report a boron-dipyrromethene dye (hereinafter referred to as "BODIPY") as a dye having excellent fastness, exhibiting the absorption band and the fluorescence band in red light region or a near-infrared light region.

In addition, Patent Literature 2 describes that a simple BODIPY dye exhibits a strong absorption band at around 500 nm, but the absorption wavelength can be extended to the near-infrared light region by the extension of π conjugated system or the introduction of an aromatic group having an electron donating substituent.

Furthermore, Patent Literatures 3 to 5 describe that the light fastness of a compound having a BODIPY structure can be further improved, and the absorption wavelength can shift a long wavelength side by B—O chelating the compound. In particular, Patent Literatures 3 and 4 describe examples in which these B—O chelated compounds are applied to an organic solar cell element and an organic photoelectric conversion element. However, in Patent Literature 3, the maximum absorption wavelength of the photoelectric conversion spectrum in the near-infrared region of the B—O chelated compound is about 750 nm, and the absorption edge is about 800 nm. Moreover, the photoelectric conversion properties thereof are inferior to the visible light region. Further, Patent Literature 5 mentions neither the absorption wavelength nor photoelectric conversion properties in the near-infrared region. That is, for use in near-infrared photoelectric conversion applications, making the photoelectric conversion wavelength further longer and high sensitivity of the photoelectric conversion properties in the near-infrared region are required.

CITATION LIST

Patent Literature

Patent Literature 1: JP 2017-137264 A
Patent Literature 2: JP 1999-255774 A
Patent Literature 3: JP 2012-199541 A
Patent Literature 4: JP 2016-166284 A
Patent Literature 5: WO 2013/035303 A Non-Patent Literature Non-Patent literature 1: Chem. Soc. Rev., 2014, 43, 4778-4823
Non-Patent literature 2: Chem. Rev., 2007, 107, 4891-4932

SUMMARY OF THE INVENTION

Technical Problem

The object of the present invention is to provide an organic compound having a wide absorption band in the near-infrared region and having an excellent photoelectric conversion efficiency in the near-infrared region, a near-infrared light absorbing material containing the organic compound, an organic thin film containing the near-infrared light absorbing material, an organic electronics device containing the organic thin film, and an organic photoelectric conversion element containing the organic thin film.

Solution to Problem

The present inventors have studied to solve the problems mentioned above and reached a dibenzopyrromethene boron chelate compound which exhibits sufficient performance when the compound is used in the organic electronics device. In addition, the present inventors have found that the organic electronics device using the compound functions as a near-infrared photoelectric conversion element and have completed the present invention. That is, the present invention is as follows.

[1] A compound of the following formula (1);

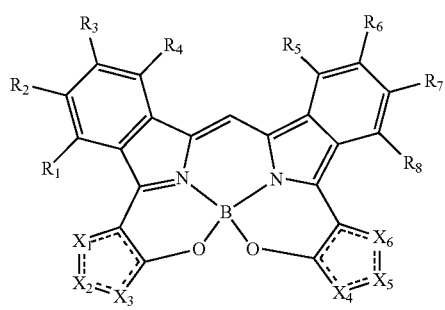

(1)

wherein in the formula (1), $R_1$ to $R_8$ are each a hydrogen atom, aliphatic hydrocarbon group, alkoxy group, alkylthio group, aromatic group, heterocyclic group, a halogen atom, hydroxyl group, mercapto group, nitro group, substituted amino group, unsubstituted amino group, cyano group, sulfo group, or acyl group, provided that at least one of $R_1$ to $R_4$ is the group or the atom other than the hydrogen atom, and at least one of $R_5$ to $R_8$ is the group or the atom other than the hydrogen atom, wherein one of $X_1$ to $X_3$ is a sulfur atom, and the remaining two of $X_1$ to $X_3$ are carbon atoms having one $R_0$, wherein one of $X_4$ to $X_6$ is a sulfur atom, the remaining two of $X_4$ to $X_6$ are carbon atoms having one $R_0$, wherein $R_0$ is each independently a hydrogen atom, aliphatic hydrocarbon group, alkoxy group, alkylthio group, aromatic group, heterocyclic group, a halogen atom, hydroxyl group, mercapto group, nitro group, substituted amino group, unsubstituted amino group, cyano group, sulfo group, or acyl group, and wherein when $X_1$ and $X_2$ are each $R_0C$, $X_2$ and $X_3$ are each $R_0C$, $X_4$ and $X_5$ are each $R_0C$, or $X_5$ and $X_6$ are each $R_0C$, the adjacent $R_0$s may be bonded to each other to form a cyclic structure.

[2] The compound according to [1] wherein the compound has the following formula (2);

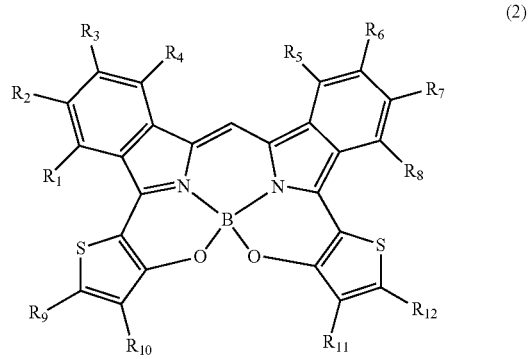

(2)

wherein in the above formula (2), $R_1$ to $R_8$ are each the same group or atom as $R_1$ to $R_8$ in the formula (1) according to [1], wherein $R_9$ to $R_{12}$ are each independently a hydrogen atom, aliphatic hydrocarbon group, alkoxy group, alkylthio group, aromatic group, heterocyclic group, a halogen atom, hydroxyl group, mercapto group, nitro group, substituted amino group, unsubstituted amino group, cyano group, sulfo group, or acyl group, and wherein $R_9$ and $R_{10}$ may be bonded to each other to form a cyclic structure, and $R_{11}$ and $R_{12}$ may be bonded to each other to form the cyclic structure.

[3] The compound according to [1] or [2], wherein at least one of $R_1$ to $R_4$ is aliphatic hydrocarbon group, aromatic group, heterocyclic group or a halogen atom, and at least one of $R_5$ to $R_8$ is aliphatic hydrocarbon group, aromatic group, heterocyclic group or a halogen atom.

[4] The compound according to [3], wherein at least one of $R_1$ to $R_4$ is a halogen atom, and at least one of $R_5$ to $R_8$ is a halogen atom,

[5] The compound according to [4], wherein at least one of $R_1$ to $R_4$ is aliphatic hydrocarbon group, aromatic group or heterocyclic group, and at least one of $R_5$ to $R_8$ is aliphatic hydrocarbon group, aromatic group or heterocyclic group,

[6] The compound according to any one of [1] to [5], wherein $R_1$ and $R_8$ are the same, $R_2$ and $R_7$ are the same, $R_3$ and $R_6$ are the same, and $R_4$ and $R_5$ are the same,

[7] The compound according to any one of [2] to [6], wherein at least one of $R_9$ and $R_{10}$ is aromatic group, heterocyclic group or a halogen atom, and at least one of $R_{11}$ and $R_{12}$ is aromatic group, heterocyclic group or a halogen atom,

[8] A near-infrared light absorbing material comprising the compound according to any one of [1] to [7],

[9] An organic thin film comprising the near-infrared light absorbing material according to [8],

[10] An organic electronics device comprising the organic thin film according to [9], and,

[11] An organic photoelectric conversion element comprising the organic thin film according to [9].

Advantageous Effects of Invention

The organic thin film using the compound of the present invention has a main absorption band in the near-infrared light region. Moreover, the near-infrared photoelectric conversion element is realized by using the compound and/or the thin film. The compound can be used in various organic electronics devices.

BRIEF DESCRIPTION OF DRAWINGS

FIG. 1 shows a cross-sectional view illustrating an embodiment of the photoelectric conversion element of the present invention.

FIG. 2 shows a schematic cross-sectional view showing an example of the layer structure of the organic electroluminescent element.

FIG. 3 shows an absorption spectrum of the organic thin film of Example 10.

FIG. 4 shows an absorption spectrum of the organic thin film of Example 11.

FIG. 5 shows an absorption spectrum of the organic thin film of Example 12.

FIG. 6 shows an absorption spectrum of the organic thin film of Example 13.

FIG. 7 shows an absorption spectrum of the organic thin film of Example 14.

FIG. 8 shows an absorption spectrum of the organic thin film of Comparative Example 2.

FIG. 9 shows a photocurrent responsiveness of the organic photoelectric conversion element of Example 15.

FIG. 10 shows a photocurrent responsiveness of the organic photoelectric conversion element of Example 16.

FIG. 11 shows a photocurrent responsiveness of the organic photoelectric conversion element of Example 17.

FIG. 12 shows a photocurrent responsiveness of the organic photoelectric conversion element of Example 18.

FIG. 13 shows a photocurrent responsiveness of the organic photoelectric conversion element of Comparative Example 3.

BRIEF DESCRIPTION OF THE DRAWINGS

The explanation of the requirements described herein is based on representative embodiments and the Examples of the present invention, but the present invention is not limited to such embodiments and the Examples. In the specification, the near-infrared region means the wavelength region of light in the range of 750 to 2500 nm, and the near-infrared light absorbing material (or dye) means the material (or dye) having a main absorption wavelength in the near-infrared light region, and the near-infrared luminescent material (or dye) means the material (or dye) which emits light in the near-infrared light region.

The compound of the present invention has the following general formula (1).

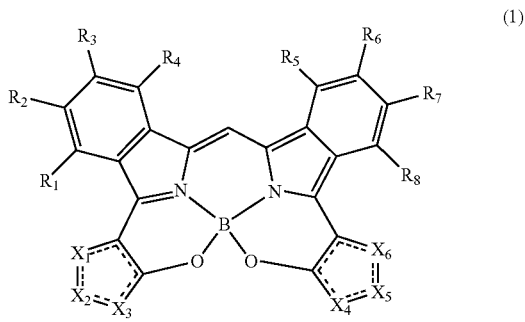

In the formula (1), $R_1$ to $R_8$ each are a hydrogen atom, aliphatic hydrocarbon group, alkoxy group, alkylthio group, aromatic group, heterocyclic group, a halogen atom, hydroxyl group, mercapto group, nitro group, substituted amino group, unsubstituted amino group, cyano group, sulfo group, or acyl group, provided that, at least one of $R_1$ to $R_4$ is the group or the atom other than the hydrogen atom, and at least one of $R_5$ to $R_8$ is the group or the atom other than the hydrogen atom. One of $X_1$ to $X_3$ is a sulfur atom, and the remaining two of $X_1$ to $X_3$ are carbon atoms having one $R_0$. One of $X_4$ to $X_6$ is a sulfur atom, and the remaining two of $X_4$ to $X_6$ are carbon atoms having one $R_0$. $R_0$ is each independently a hydrogen atom, aliphatic hydrocarbon group, alkoxy group, alkylthio group, aromatic group, heterocyclic group, a halogen atom, hydroxyl group, mercapto group, nitro group, substituted amino group, unsubstituted amino group, cyano group, sulfo group, or acyl group. When $X_1$ and $X_2$ are $R_0C$, $X_2$ and $X_3$ are $R_0C$, $X_4$ and $X_5$ are $R_0C$, or $X_5$ and $X_6$ are $R_0C$, the adjacent $R_0$s may be bonded to each other to form a cyclic structure.

The above formula (1) just shows one of the resonant structures, and the compound of the present inventions are not limited to the illustrated resonant structure.

The aliphatic hydrocarbon group represented by $R_1$ to $R_8$ in the above formula (1) can be a saturated or unsaturated aliphatic hydrocarbon and can be linear, branched or cyclic aliphatic hydrocarbon. The carbon number thereof is preferably 1 to 30, more preferably 1 to 20, and further preferably 3 to 10. Specific examples of the saturated or unsaturated linear, branched or cyclic aliphatic hydrocarbon group include methyl group, ethyl group, propyl group, isopropyl group, n-butyl group, iso-butyl group, allyl group, t-butyl group, n-pentyl group, n-hexyl group, n-octyl group, n-decyl group, n-dodecyl group, n-tridecyl group, n-tetradecyl group, n-cetyl group, n-heptadecyl group, n-butenyl group, 2-ethylhexyl group, 3-ethylheptyl group, 4-ethyloctyl group, 2-butyloctyl group, 3-butylnonyl group, 4-butyldecyl group, 2-hexyldecyl group, 3-octylundecyl group, 4-octyldodecyl group, 2-octyldodecyl group, 2-decyltetradecyl group, cyclopropyl group, cyclobutyl group, cyclopentyl group, and cyclohexyl group, etc.

The aliphatic hydrocarbon group represented by $R_1$ to $R_8$ in the formula (1) is preferably a linear or branched aliphatic hydrocarbon group, and more preferably, a saturated linear or branched alkyl group, and further preferably, n-butyl group, n-hexyl group, n-octyl group, n-decyl group, n-dodecyl group, 2-ethylhexyl group, 2-methylpropyl group or 2-butyloctyl group, especially preferably, n-hexyl group, n-octyl group or 2-methylpropyl group.

The alkoxy group represented by $R_1$ to $R_8$ in the above formula (1) is a substituent in which an oxygen atom is bonded to an alkyl group. As an alkyl group in the alkoxy group, examples include the alkyl group described as specific examples in the section of the aliphatic hydrocarbon group represented by $R_1$ to $R_8$ in the formula (1). The alkoxy group represented by $R_1$ to $R_8$ in the formula (1) may have a substituent such as an alkoxy group.

The alkylthio group represented by $R_1$ to $R_8$ in the above formula (1) is a substituent in which a sulfur atom is bonded to an alkyl group. As an alkyl group in the alkylthio group, examples include the alkyl groups described as specific examples in the section of the aliphatic hydrocarbon group represented by $R_1$ to $R_8$ in the formula (1). The alkylthio group represented by $R_1$ to $R_8$ in the formula (1) may have a substituent such as alkylthio group.

The aromatic group represented by $R_1$ to $R_8$ in the above formula (1) is a residue obtained by removing one hydrogen atom from the aromatic ring of the aromatic compound. The aromatic group represented by $R_1$ to $R_8$ in the formula (1) is not particularly limited as long as the aromatic group is a residue obtained by removing one hydrogen atom from the aromatic ring of the aromatic compound, and examples thereof include phenyl group, biphenyl group, tolyl group, indenyl group, naphthyl group, anthryl group, fluorenyl group, pyrenyl group, phenanthnyl group, and mesityl group, etc., but phenyl group, biphenyl group, tolyl group, naphthyl group or mesityl group is preferable, and phenyl group, tolyl group or mesityl group is more preferable. The aromatic compound which can provide the aromatic group may have the substituent, and the substituent to be contained is not particularly limited.

The heterocyclic group represented by $R_1$ to $R_8$ in the above formula (1) is a residue obtained by removing one hydrogen atom from the heterocyclic ring of the heterocyclic compound. The heterocyclic group represented by $R_1$ to $R_8$ in the formula (1) is not particularly limited as long as the heterocyclic group is a residue obtained by removing one hydrogen atom from the heterocyclic ring of the heterocyclic compound, and examples thereof include furanyl group, thienyl group, thienothienyl group, pyrrolyl group, imidazolyl group, N-methylimidazolyl group, thiazolyl group, oxazolyl group, pyridyl group, pyrazyl group, pyrimidyl group, quinolyl group, indolyl group, benzopyrazyl group, benzopyrimidyl group, benzothienyl group, benzothiazolyl group, pyridinothiazolyl group, benzoimidazolyl group, pyridinoimidazolyl group, N-methylbenzoimidazolyl group, pyridino-N-methyl imidazolyl group, benzoxazolyl group, pyridinooxazolyl group, benzothiadiazolyl group, pyridinothiadiazolyl group, benzooxadiazolyl group, pyridinooxadiazolyl group, carbazolyl group, phenoxazinyl group, or phenothiazinyl group, etc., but thienyl group, thienothienyl group, thiazolyl group, pyridyl group, benzothiazolyl group, benzothiadiazolyl group, or pyridinothiadiazolyl group is preferable, and thienyl group, thiazolyl group, benzothiazolyl group, benzothiadiazolyl group, or pyridinothiadiazolyl group is more preferable. The heterocyclic compound which can provide the heterocyclic group may have the substituent, and the substituent to be contained is not particularly limited.

Examples of the halogen atom represented by $R_1$ to $R_8$ in the above formula (1) include a fluorine atom, a chlorine atom, a bromine atom and an iodine atom. A fluorine atom or a chlorine atom is preferable, and a fluorine atom is more preferable.

The substituted amino group represented by $R_1$ to $R_8$ in the above formula (1) is a substituent in which a hydrogen atom of the amino group is substituted by one or two substituents. As a substituent which the substituted amino group has, the alkyl group or the aromatic group is preferable, and the aromatic group is more preferable. Specific examples of these substituents include an alkyl group which is the same as alkyl group described in the section of the aliphatic hydrocarbon group represented by $R_1$ to $R_8$ in the formula (1) and the aromatic group represented by $R_1$ to $R_8$ in the formula (1).

The acyl group represented by $R_1$ to $R_8$ in the above formula (1) is a substituent in which the carbonyl group is bonded to the aromatic group or the alkyl group. As an alkyl group and an aromatic group in the acyl group, examples include an alkyl group which is the same as the alkyl group described in the section of the aliphatic hydrocarbon group represented by $R_1$ to $R_8$ in the formula (1) and an aromatic group which is the same as the aromatic group represented by $R_1$ to $R_8$ in the formula (1).

Regarding $R_1$ to $R_8$ in the formula (1), preferably, one of $R_1$ to $R_4$ is aliphatic hydrocarbon group, a halogen atom, aromatic group, or heterocyclic group, and the remaining three are hydrogen atoms, and one of $R_5$ to $R_8$ is aliphatic hydrocarbon group, a halogen atom, aromatic group, or heterocyclic group, and the remaining three are hydrogen atoms. More preferably, one of $R_1$ to $R_4$ is aromatic group, heterocyclic group or a halogen atom, and the remaining three are hydrogen atoms, and one of $R_5$ to $R_8$ is aromatic group, heterocyclic group or a halogen atom, and the remaining three are hydrogen atoms. Further preferably, one of $R_1$ to $R_4$ is a halogen atom, and the remaining three are hydrogen atoms, and one of $R_5$ to $R_8$ is a halogen atom, and the remaining three are hydrogen atoms.

In more detail, preferably, $R_2$ and $R_7$ are each independently aliphatic hydrocarbon group, a halogen atom, aromatic group, heterocyclic group or substituted amino group, and $R_1$, $R_3$ to $R_6$ and $R_8$ are hydrogen atoms or $R_3$ and $R_6$ are each independently aliphatic hydrocarbon group, a halogen atom, aromatic group, heterocyclic group, or substituted amino group, and $R_1$, $R_2$, $R_4$, $R_5$, $R_7$ and $R_8$ are hydrogen atoms; and more preferably, both $R_2$ and $R_7$ are the same halogen atoms, aromatic groups, or heterocyclic groups, and $R_1$, $R_3$ to $R_6$ and $R_8$ are hydrogen atoms, or both of $R_3$ and $R_6$ are the same halogen atoms, aromatic groups, or heterocyclic groups, and $R_1$, $R_2$, $R_4$, $R_5$, $R_7$ and $R_8$ are hydrogen atoms; and further preferably, both $R_2$ and $R_7$ are the same halogen atoms, and $R_1$ and $R_3$ to $R_6$ and $R_8$ are hydrogen atoms, or both $R_3$ and $R_6$ are the same halogen atoms, and $R_1$, $R_2$, $R_4$, $R_5$, $R_7$ and $R_8$ are hydrogen atoms.

Also, preferably, two or more of $R_1$ to $R_4$ in the formula (1) are each independently aliphatic hydrocarbon group, a halogen atom, aromatic group, or heterocyclic group, and two or more of $R_5$ to $R_8$ are each independently aliphatic hydrocarbon group, a halogen atom, aromatic group, or heterocyclic group; more preferably, two or more of $R_1$ to $R_4$ in the formula (1) are each independently aromatic group, heterocyclic group, or a halogen atom, and two or more of $R_5$ to $R_8$ are each independently aliphatic hydrocarbon group, a halogen atom, aromatic group, or heterocyclic group.

Furthermore, preferably, two of $R_1$ to $R_4$ are each independently aliphatic hydrocarbon group, a halogen atom, aromatic group, or heterocyclic group, and two of $R_5$ to $R_8$ are each independently aliphatic hydrocarbon group, a halogen atom, aromatic group, or heterocyclic group, more preferably, two of $R_1$ to $R_4$ are each independently a halogen atom, aromatic group, or heterocyclic group, and two of $R_5$ to $R_8$ are each independently a halogen atom, aromatic group, or heterocyclic group; further preferably, one of $R_1$ to $R_4$ is a halogen atom, and the other one is a halogen atom, aromatic group, or heterocyclic group, and one of $R_5$ to $R_8$ is a halogen atom, and the other one is a halogen atom, and the other one is a halogen atom, aromatic group, or heterocyclic group.

One of $X_1$ to $X_3$ in the formula (1) is a sulfur atom, and the remaining two are carbon atoms having one $R_0$. One of $X_4$ to $X_6$ is a sulfur atom, and the remaining two are carbon atoms having one $R_0$. In other words, the 5-membered ring containing $X_1$ to $X_3$ and the 5-membered ring containing $X_4$ to $X_6$ in the formula (1) are each a thiophene ring, and $R_0$ is a substituent having the thiophene ring or a hydrogen atom. That is, the compound represented by the formula (1) may be any of the compounds represented by the following formulas (1-a) to (1-i).

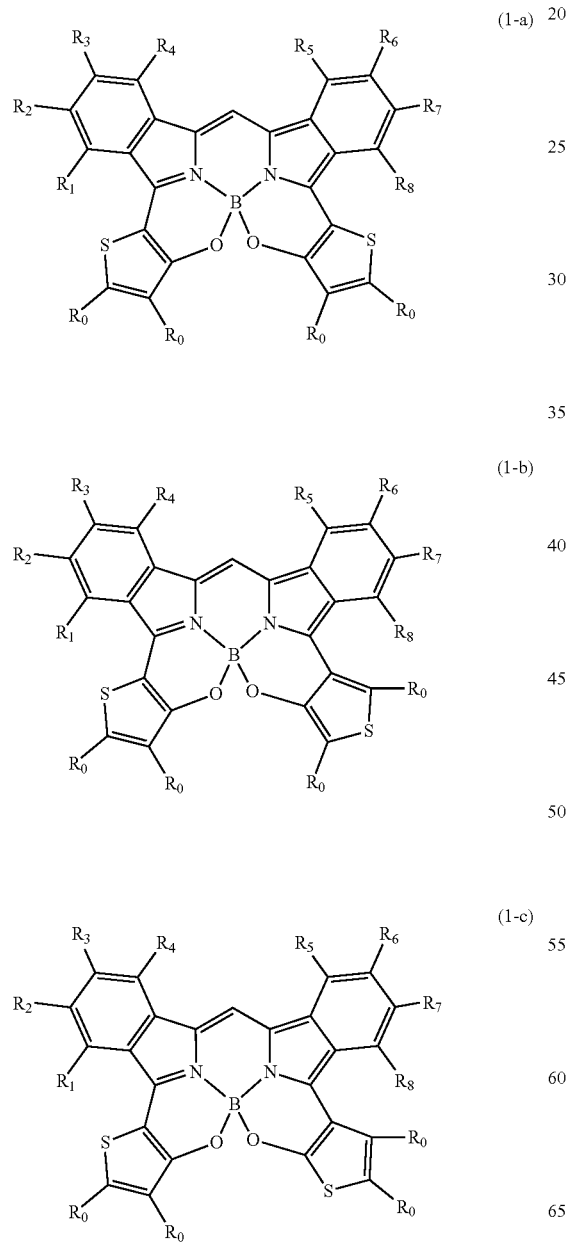

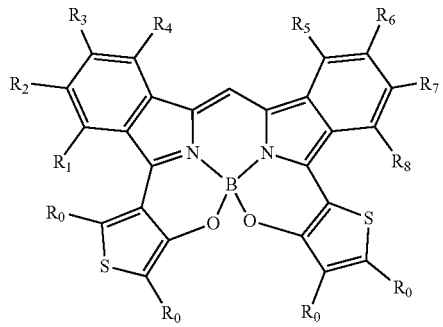

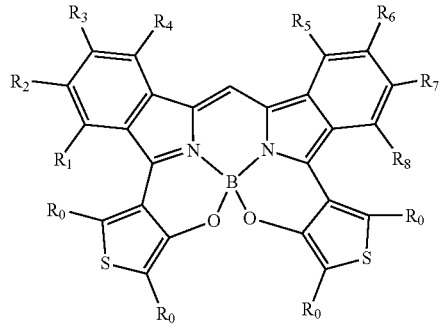

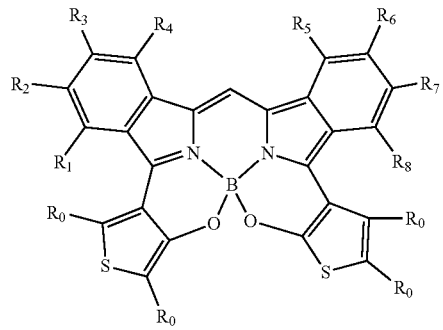

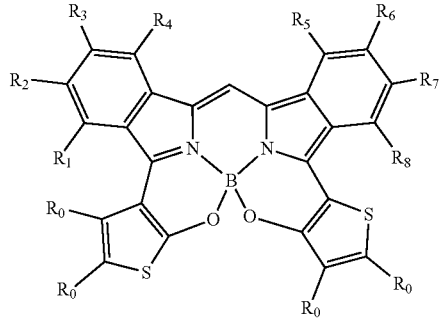

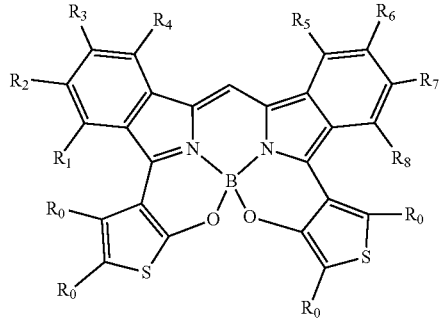

-continued

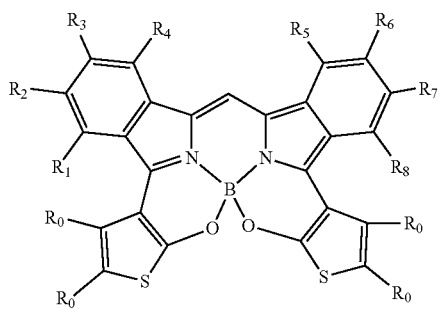

(1-i)

$R_0$ in the formula (1) is each independently a hydrogen atom, aliphatic hydrocarbon group, alkoxy group, alkylthio group, aromatic group, heterocyclic group, a halogen atom, hydroxyl group, mercapto group, nitro group, substituted amino group, unsubstituted amino group, cyano group, sulfo group, or acyl group.

The aliphatic hydrocarbon group, the alkoxy group, the alkylthio group, the aromatic group, heterocyclic group, the halogen atom, the substituted amino group, and the acyl group represented by $R_0$ in the formula (1) include ones which are the same as the aliphatic hydrocarbon group, the alkoxy group, the alkylthio group, the aromatic group, the heterocyclic group, the halogen atom, the substituted amino group, and the acyl group represented by $R_1$ to $R_8$ in the formula (1).

$R_0$ in the formula (1) is preferably each independently a hydrogen atom, aliphatic hydrocarbon group, a halogen atom, aromatic group, heterocyclic group, or substituted amino group, more preferably each independently a hydrogen atom, aromatic group, or heterocyclic group.

Further, preferably, $X_1$ and $X_6$ are the same, $X_2$ and $X_5$ are the same, and $X_3$ and $X_4$ are the same; and more preferably, $X_1$ and $X_6$ are sulfur atoms, $R_0$ of $CR_0$ represented by $X_2$ and $R_0$ of $CR_0$ represented by $X_5$ are the same hydrogen atoms, aliphatic hydrocarbon groups, halogen atoms, aromatic groups, heterocyclic groups, or substituted amino groups, and $R_0$ of $CR_0$ represented by $X_3$ and $R_0$ of $CR_0$ represented by $X_4$ are the same hydrogen atoms, aliphatic hydrocarbon groups, halogen atoms, aromatic groups, heterocyclic groups, or substituted amino group; further preferably, $X_1$ and $X_6$ are sulfur atoms, $R_0$ of $CR_0$ represented by $X_2$ and $R_0$ of $CR_0$ represented by $X_5$ are the same aliphatic hydrocarbon groups, halogen atoms, aromatic groups, heterocyclic groups, or substituted amino groups, and $R_0$ of $CR_0$ represented by $X_3$ and $R_0$ of $CR_0$ represented by $X_4$ are hydrogen atoms, or $X_1$ and $X_6$ are sulfur atoms, $R_0$ of $CR_0$ represented by $X_2$ and $R_0$ of $CR_0$ represented by $X_5$ are hydrogen atoms, and $R_0$ of $CR_0$ represented by $X_3$ and $R_0$ of $CR_0$ represented by $X_4$ are the same aliphatic hydrocarbon groups, halogen atoms, aromatic groups, heterocyclic groups, or substituted amino groups; especially preferably, $X_1$ and $X_6$ are sulfur atoms, $R_0$ of $CR_0$ represented by $X_2$ and $R_0$ of $CR_0$ represented by $X_5$ are the same aromatic groups, heterocyclic groups, or halogen atoms, and $R_0$ of $CR_0$ represented by $X_3$ and $R_0$ of $CR_0$ represented by $X_4$ are hydrogen atoms, or $X_1$ and $X_6$ are sulfur atoms, $R_0$ of $CR_0$ represented by $X_2$ and $R_0$ of $CR_0$ represented by $X_5$ are hydrogen atoms, and $R_0$ of $CR_0$ represented by $X_3$ and $R_0$ of $CR_0$ represented by $X_4$ are the same aromatic groups, heterocyclic groups, or halogen atoms; and most preferably, $X_1$ and $X_6$ are sulfur atoms, $R_0$ of $CR_0$ represented by $X_2$ and $R_0$ of $CR_0$ represented by $X_5$ are the same aromatic groups, heterocyclic groups, or halogen atoms, and $R_0$ of $CR_0$ represented by $X_3$ and $R_0$ of $CR_0$ represented by $X_4$ are hydrogen atoms.

When $X_1$ and $X_2$ are $R_0C$, $X_2$ and $X_3$ are $R_0C$, $X_4$ and $X_5$ are $R_0C$, or $X_5$ and $X_6$ are $R_0C$, the adjacent $R_0s$ may be bonded to each other to form a cyclic structure.

As a cyclic structure formed by bonding the adjacent $R_0s$ to each other, examples include 5-membered or 6-membered aromatic rings such as a benzene ring, a naphthalene ring, a furan ring, a pyrrol ring, an imidazole ring, an thiophene ring, a pyrazole ring, an oxazole ring, a thiazole ring, a pyridine ring and a pyrazine ring. Among them, a cyclic structure with the benzene ring and the thiophene ring is preferable, and more specifically, preferably, a cyclic structure formed by bonding the 5-membered ring containing $X_1$ to $X_3$ and the adjacent $R_0s$ to each other and a cyclic structure formed by bonding the 5-membered ring containing $X_4$ to $X_6$ and the adjacent $R_0s$ to each other are each a benzothiophene ring or thienothiophene ring. The cyclic structure formed by bonding the adjacent $R_0s$ to each other may have a substituent, and the substituents which may be contained in the cyclic structure and the preferred examples thereof include ones which are the same as the aliphatic hydrocarbon group, alkoxy group, alkylthio group, aromatic group, heterocyclic group, a halogen atom, hydroxyl group, mercapto group, nitro group, substituted amino group, unsubstituted amino group, cyano group, sulfo group, and acyl group represented by $R_1$ to $R_8$ in the formula (1).

As a compound represented by the formula (1) of the present invention, the compound represented by the following formula (2) is preferable.

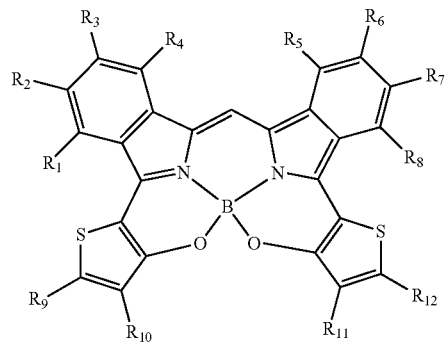

(2)

$R_1$ to $R_8$ in the above formula (2) are the same as $R_1$ to $R_8$ in the above formula (1), and the preferable ones are also the same as $R_1$ to $R_8$ in the above formula (1).

$R_9$ to $R_{12}$ in the above formula (2) are each independently a hydrogen atom, aliphatic hydrocarbon group, alkoxy group, alkylthio group, aromatic group, heterocyclic group, a halogen atom, hydroxyl group, mercapto group, nitro group, substituted amino group, unsubstituted amino group, cyano group, sulfo group, or acyl group. $R_9$ and $R_{10}$ may be bonded to each other to form a cyclic structure, and $R_{11}$ and $R_{12}$ may be bonded to each other to form the cyclic structure.

The aliphatic hydrocarbon group, the alkoxy group, the alkylthio group, the aromatic group, the heterocyclic group, the halogen atom, the substituted amino group, and the acyl group represented by $R_9$ to $R_{12}$ in the above formula (2) include the same as the aliphatic hydrocarbon group, the alkoxy group, the alkylthio group, the aromatic group, the heterocyclic group, the halogen atom, the substituted amino group and the acyl group represented by $R_1$ to $R_8$ in the above formula (1), and the preferable ones are also the same.

A cyclic structure which may be formed by bonding $R_9$ and $R_{10}$ to each other and a cyclic structure which may be formed by bonding $R_{11}$ and $R_{12}$ to each other in the above formula (2) are the same as the cyclic structure which may be formed by bonding the adjacent $R_0s$ to each other, when $X_1$ and $X_2$ are each $R_0C$, $X_2$ and $X_3$ are each $R_0C$, $X_4$ and $X_5$ are each $R_0C$, or $X_5$ and $X_6$ are each $R_0C$, and the preferable ones are also the same.

Regarding $R_9$ to $R_{12}$ in the above formula (2), preferably, at least one of $R_9$ and $R_{10}$ is aliphatic hydrocarbon group, a halogen atom, aromatic group, heterocyclic group, or substituted amino group, and at least one of $R_{11}$ and $R_{12}$ is aliphatic hydrocarbon group, a halogen atom, aromatic group, heterocyclic group, or substituted amino group, more preferably at least one of $R_9$ and $R_{10}$ is a halogen atom, aromatic group, or heterocyclic group, and at least one of $R_{11}$ and $R_{12}$ is a halogen atom, aromatic group, or heterocyclic group.

Regarding $R_9$ to $R_{12}$, preferably, $R_9$ and $R_{12}$ are the same hydrogen atoms, aliphatic hydrocarbon groups, halogen atoms, aromatic groups, heterocyclic groups, or substituted amino groups, and $R_{10}$ and $R_{11}$ are the same hydrogen atoms, aliphatic hydrocarbon groups, halogen atoms, aromatic groups, heterocyclic groups, or substituted amino groups; more preferably, $R_9$ and $R_{12}$ are the same aliphatic hydrocarbon groups, halogen atoms, aromatic groups, heterocyclic groups, or substituted amino groups, and $R_{10}$ and $R_{11}$ are hydrogen atoms, or $R_9$ and $R_{12}$ are hydrogen atoms, and $R_{10}$ and $R_{11}$ are the same aliphatic hydrocarbon groups, halogen atoms, aromatic groups, heterocyclic groups, or substituted amino groups; further preferably, $R_9$ and $R_{12}$ are the same aromatic groups, heterocyclic groups, or halogen atoms, and $R_{10}$ and $R_{11}$ are hydrogen atoms, or $R_9$ and $R_{12}$ are hydrogen atoms, and $R_{10}$ and $R_{11}$ are the same aromatic groups, heterocyclic groups, or halogen atoms; especially preferably $R_9$ and $R_{12}$ are the same aromatic groups, heterocyclic groups, or halogen atoms, and $R_{10}$ and $R_{11}$ are hydrogen atoms.

The above structural formulas just show one of the resonant structures, and the structure of the compound is not limited to the illustrated resonant structures.

The compound represented by the above general formula (1) can be obtained, for example, by the following reaction process with reference to the description of Tetrahedron Letters, 2010, 51, 1600.

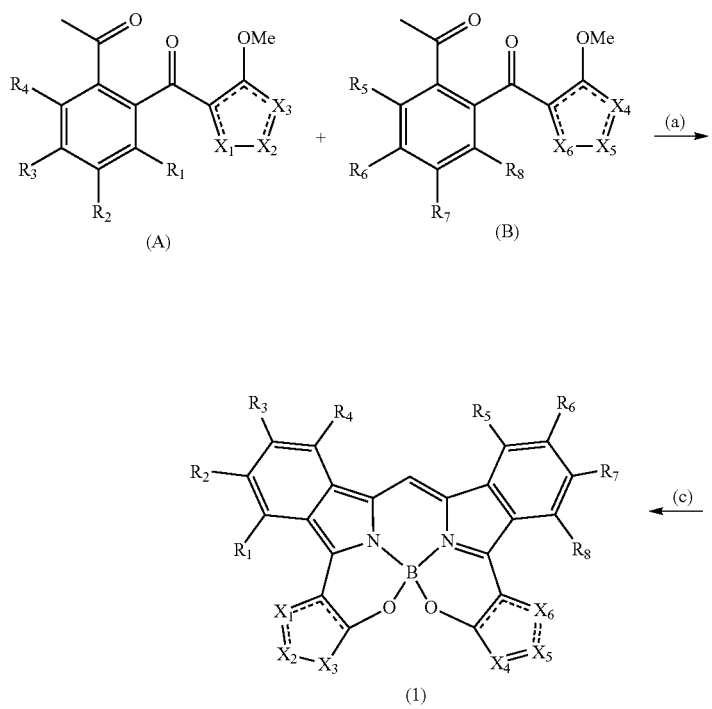
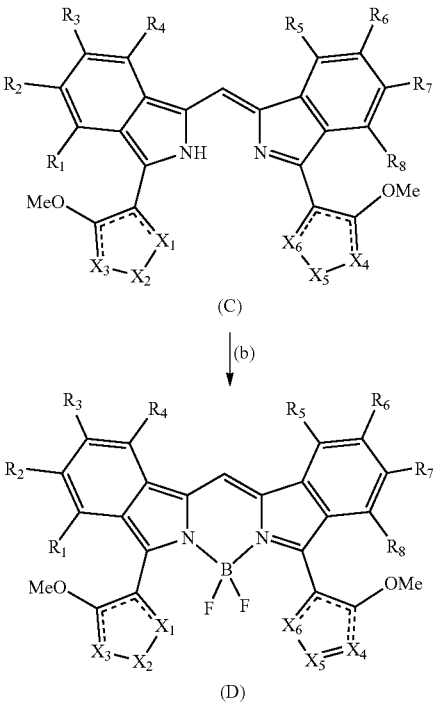

In the above reaction process, step (a) of obtaining a compound (C) by reacting a compound (A) with a compound (B) can be carried out, for example, by adding ammonium salt (e.g., ammonium acetate, ammonium chloride) or ammonia water to a mixed solvent of alcohol and acetic acid. When $R_1$ to $R_4$ and $X_1$ to $X_3$ in the compound (A) are the same as $R_8$ to $R_5$ and $X_6$ to $X_4$ in the compound (B), i.e., the compound (A) and the compound (B) are the same, step (a) can also be carried out with the compound (A) (or the compound (B)) alone. Then, step (b) of obtaining a compound (D) from the compound (C) can be carried out, for example, by reacting the compound (C) with boron trifluorides (e.g., boron trifluoride diethyl ether complex) in the presence of a tertiary amine (e.g., triethylamine). Finally, step (c) of obtaining an organic compound represented by the general formula (1) from the compound (D) can be carried out, for example, by reacting the compound (D) with boron tribromide.

The purification method of the compound represented by the above general formula (1) is not particularly limited, and for example, washing, recrystallization, column chromatography, vacuum sublimation and the like can be applied, and these methods can be combined as necessary.

As a specific example of the compound represented by the above formula (1), the compounds represented by the formulas (1-1) to (1-126) are shown below, but the present invention is not limited thereto. The structural formulas shown as specific examples just show one of the resonant structures, and the structure of the compound is not limited to the illustrated resonant structures.

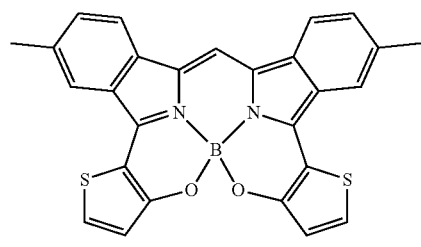
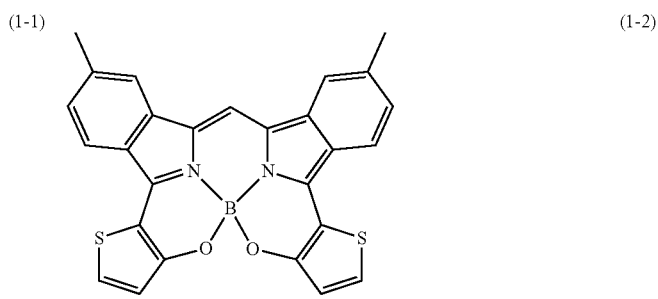

-continued
(1-11)
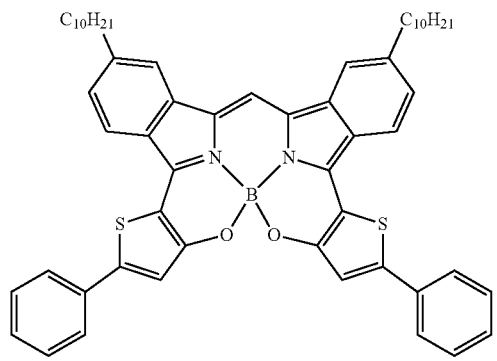
(1-12)
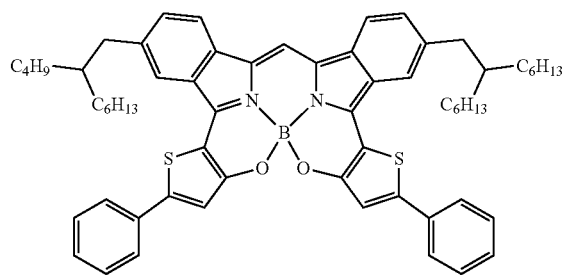
(1-13)
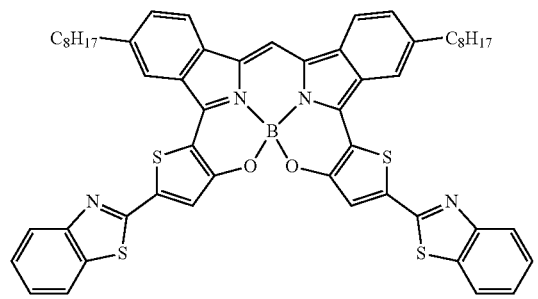
(1-14)
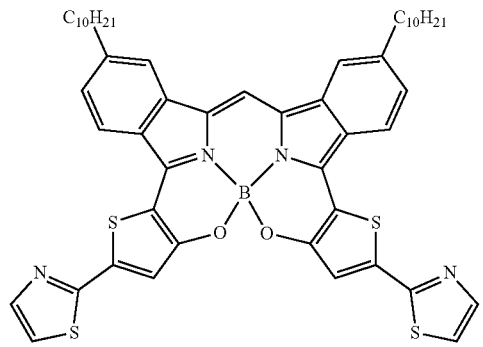
(1-15)
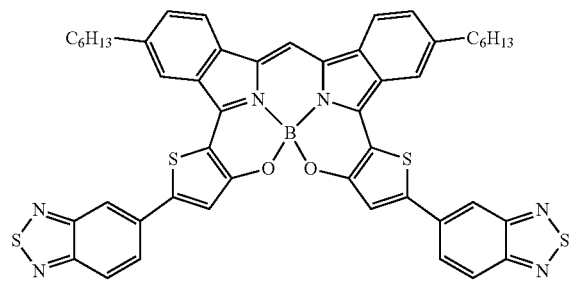
(1-16)
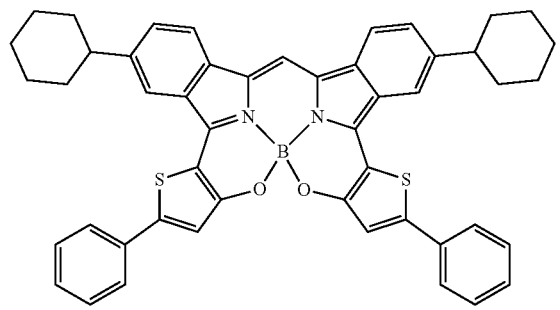
(1-17)
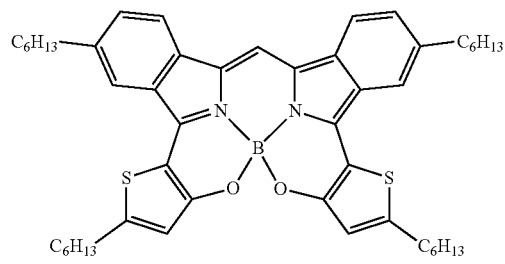
(1-18)
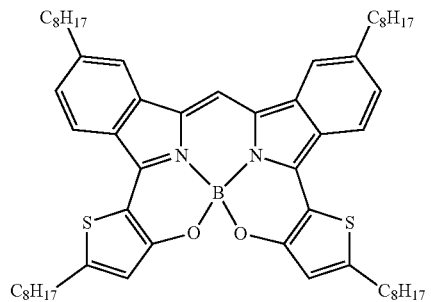

-continued
(1-19) 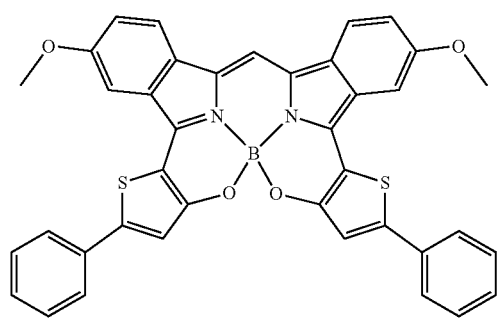
(1-20) 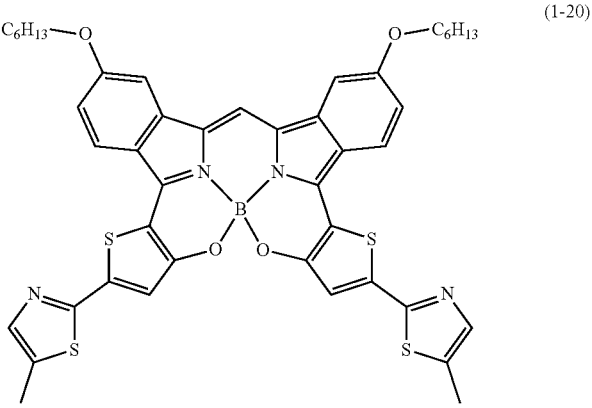
(1-21) 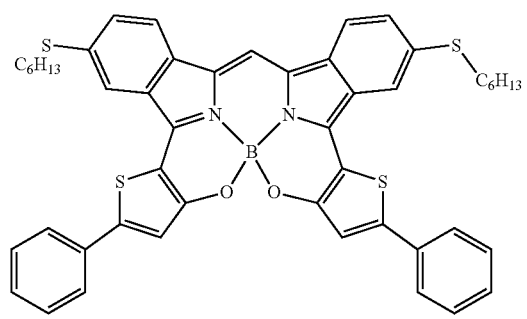
(1-22) 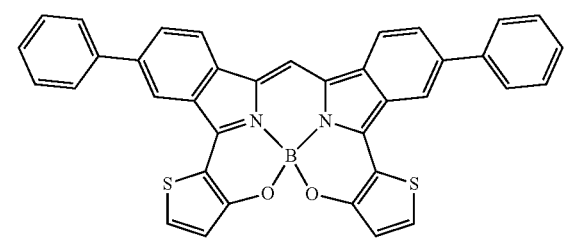
(1-23) 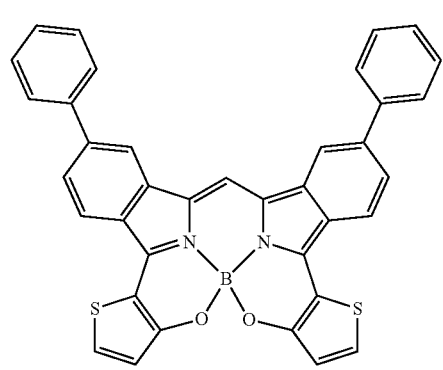
(1-24) 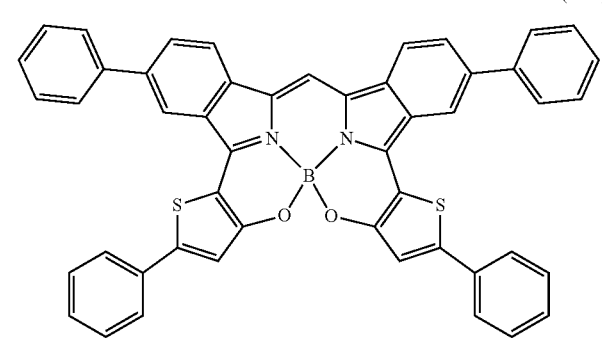
(1-25) 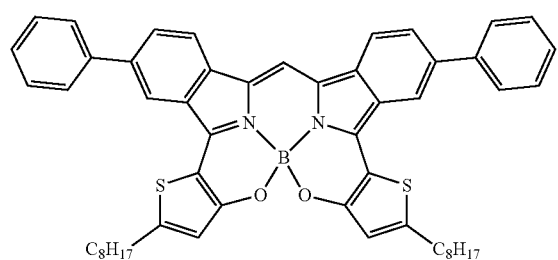
(1-26) 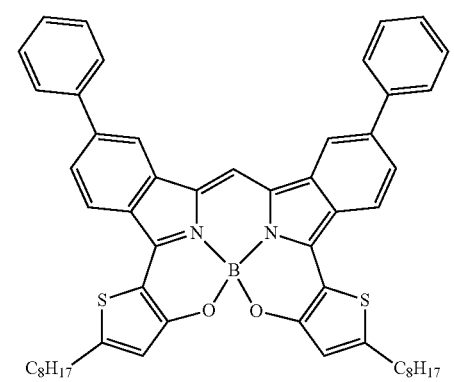

-continued
(1-27)
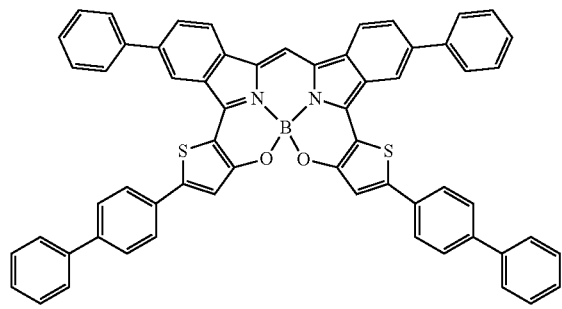
(1-28)
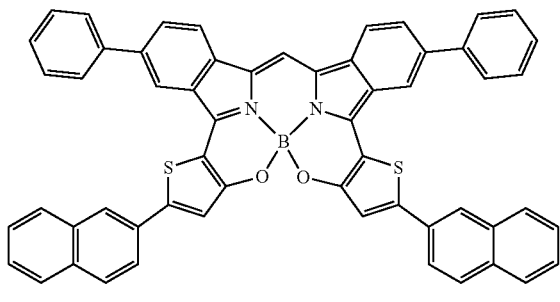
(1-29)
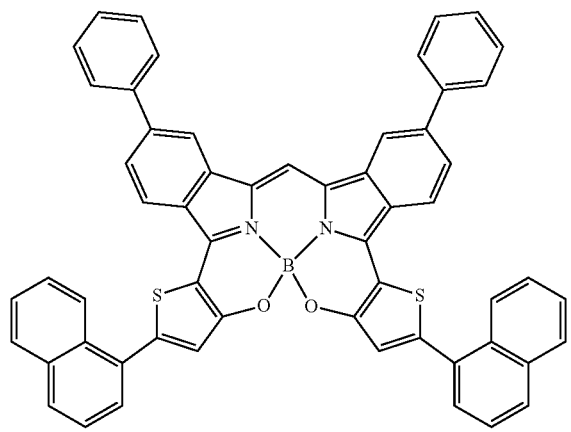
(1-30)
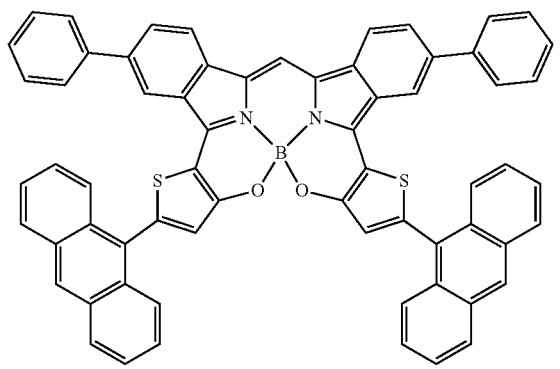
(1-31)
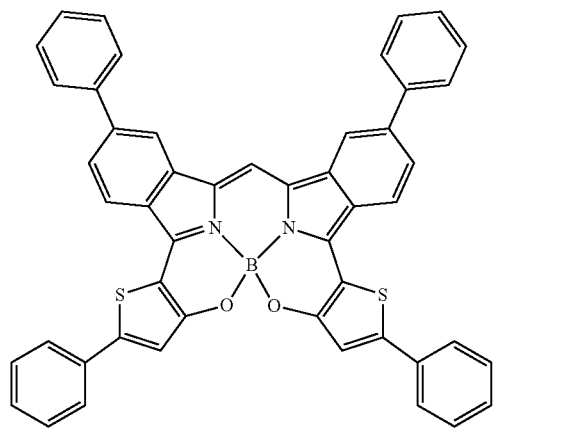
(1-32)
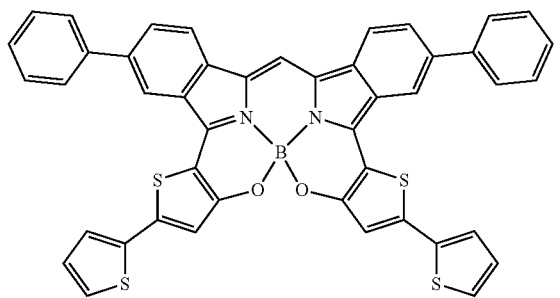
(1-33)
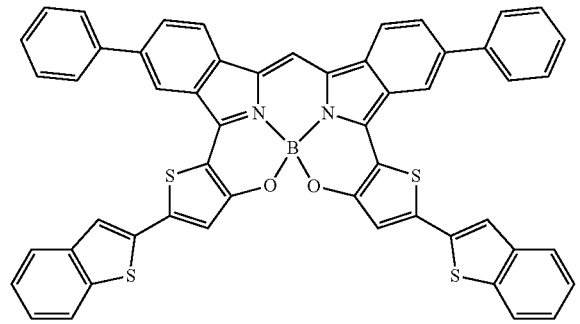
(1-34)
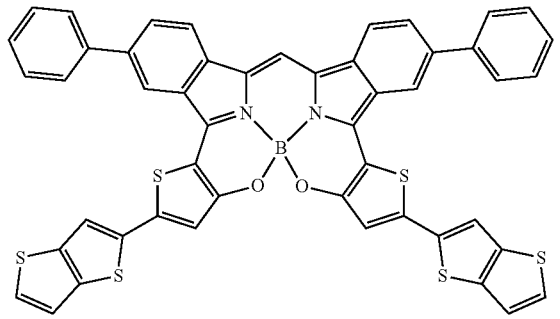

(1-35)
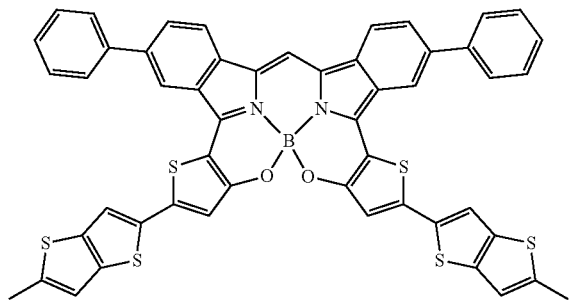
(1-36)
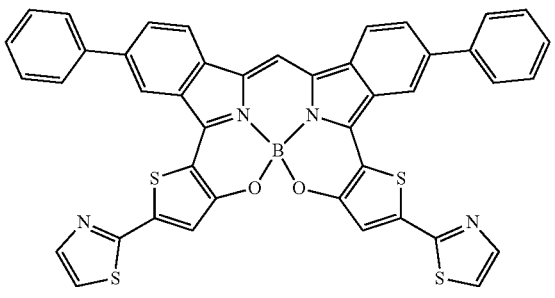
(1-37)
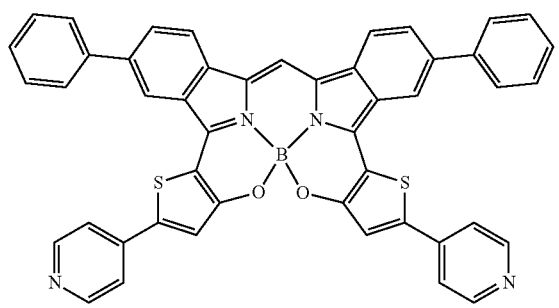
(1-38)
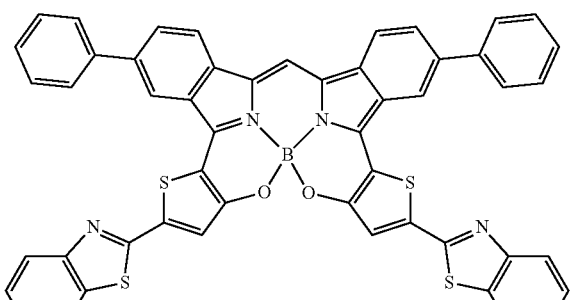
(1-39)
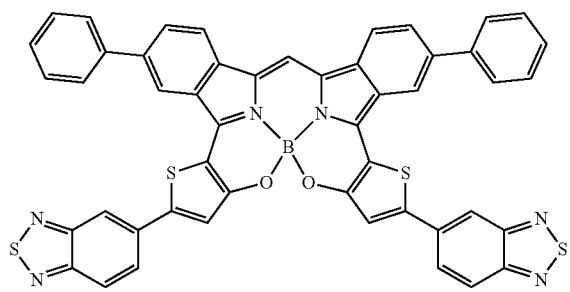
(1-40)
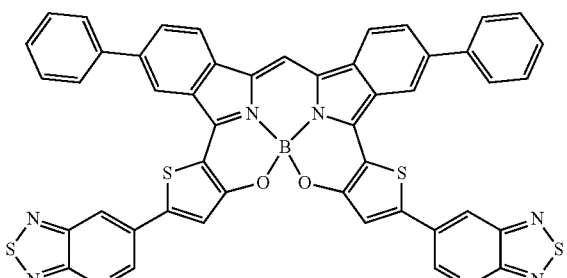
(1-41)
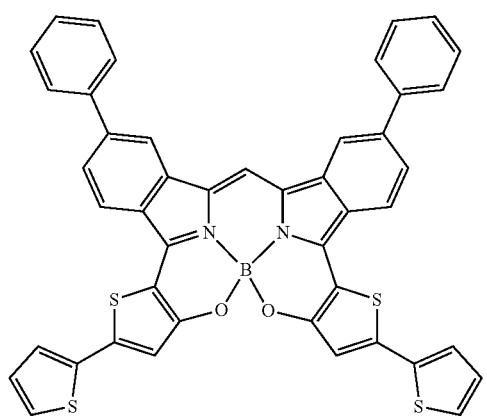
(1-42)
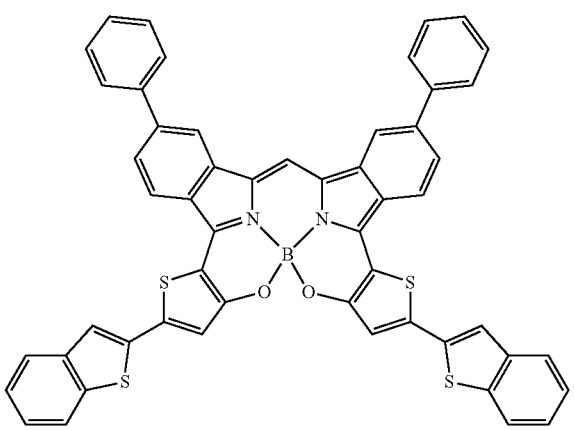

-continued
(1-43)
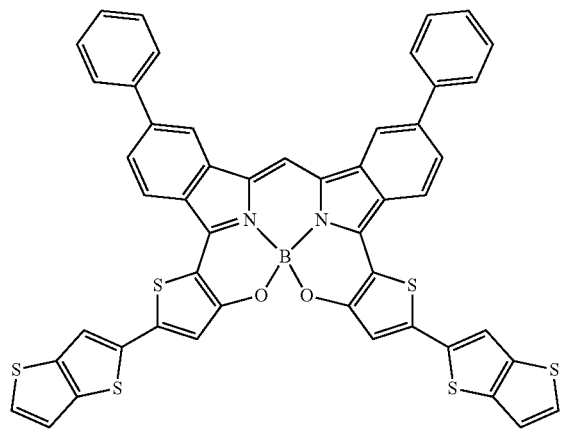
(1-44)
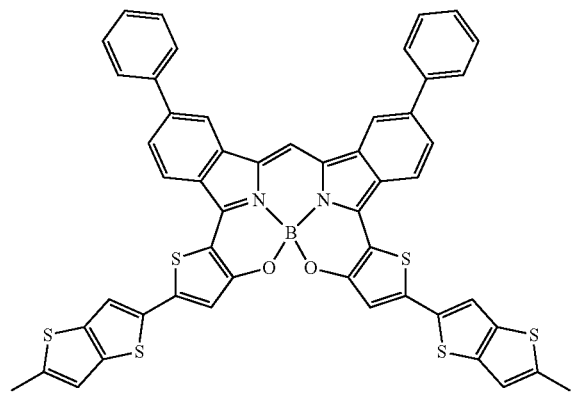
(1-45)
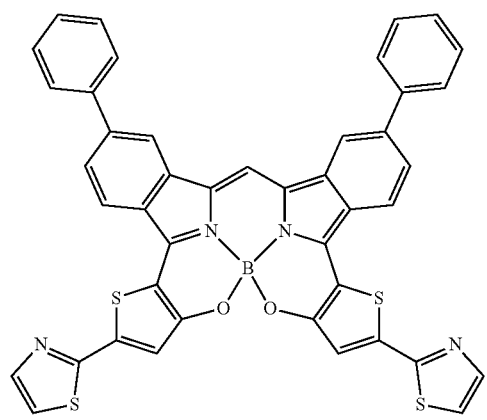
(1-46)
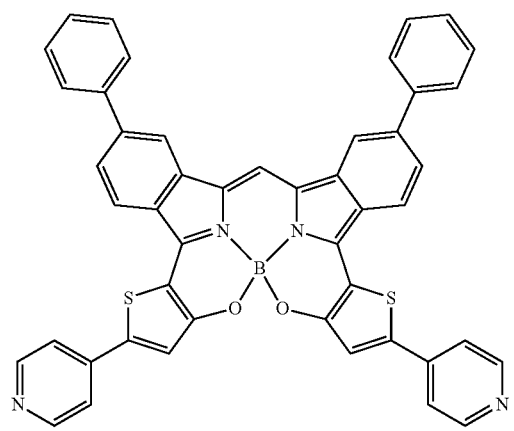
(1-47)
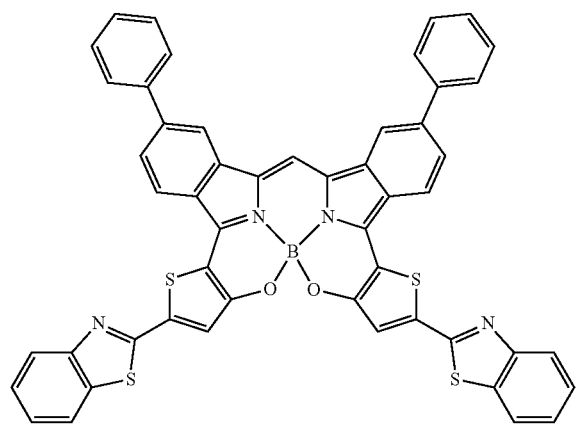
(1-48)
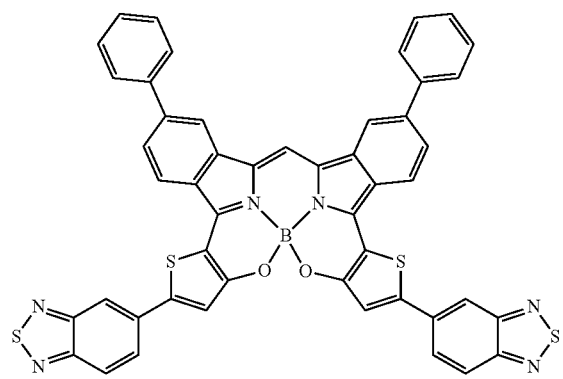

(1-49)
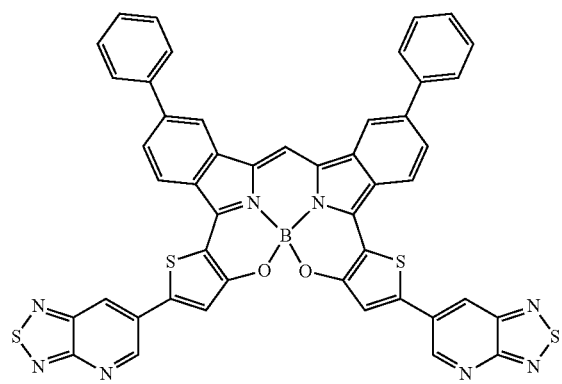
(1-50)
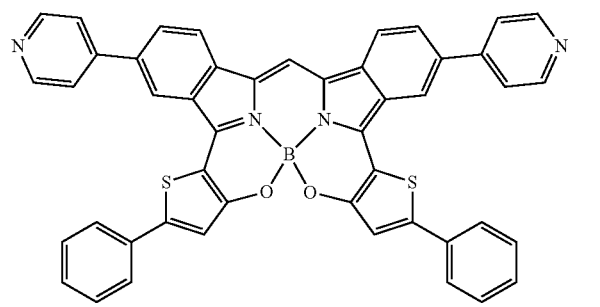
(1-51)
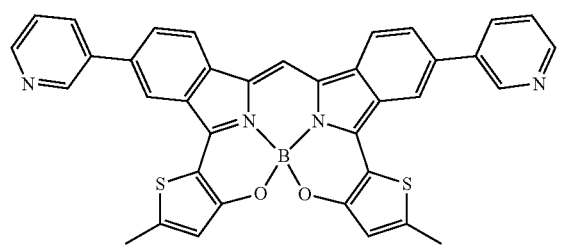
(1-52)
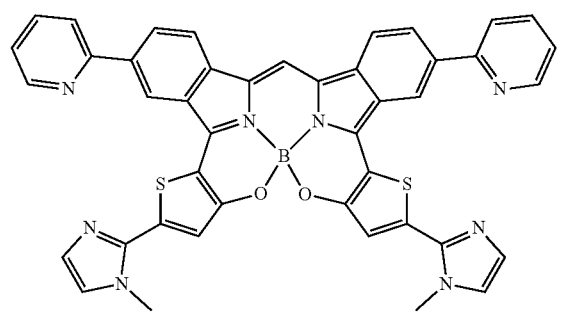
(1-53)
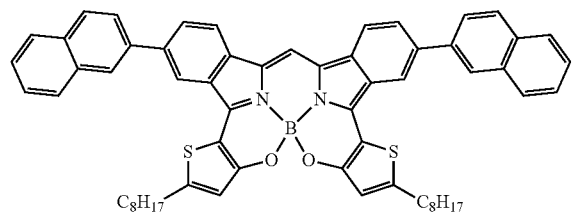
(1-54)
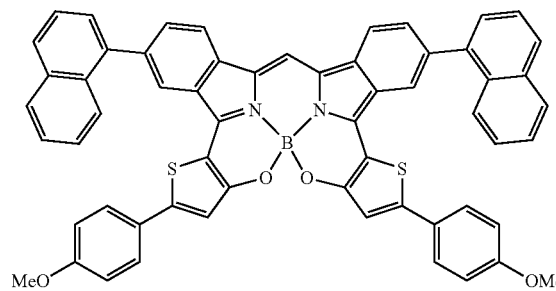
(1-55)
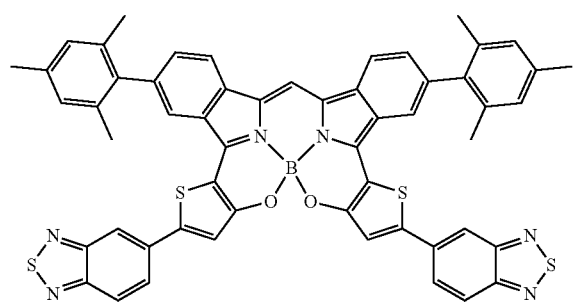
(1-56)
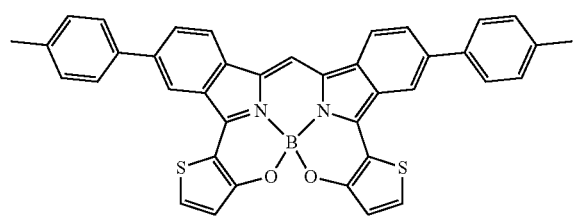

-continued
(1-57)
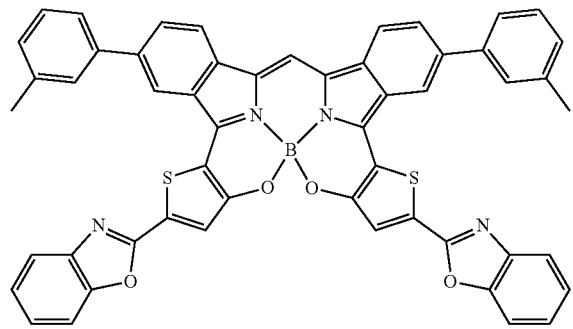
(1-58)
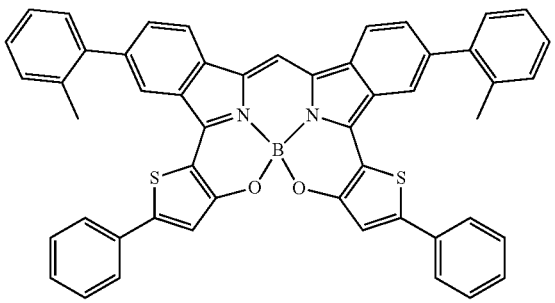
(1-59)
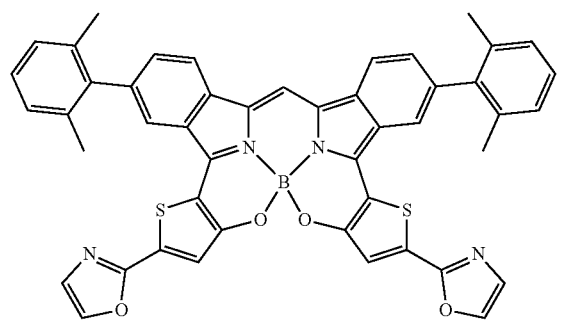
(1-60)
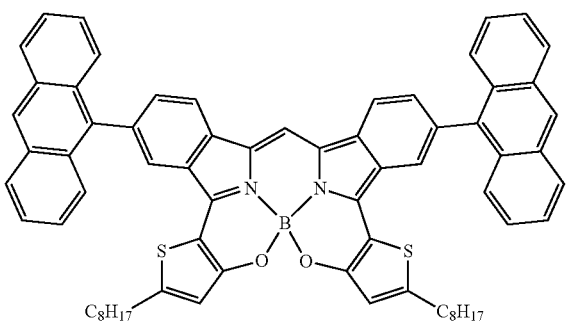
(1-61)
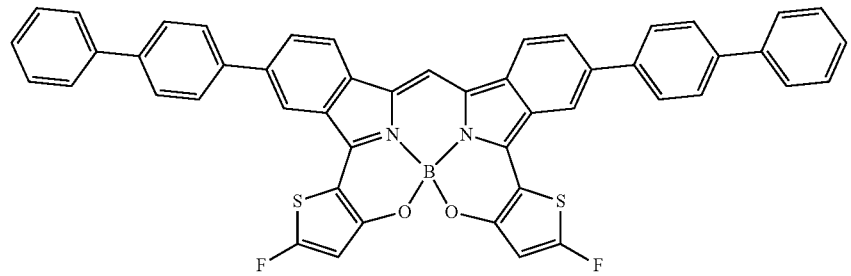
(1-62)
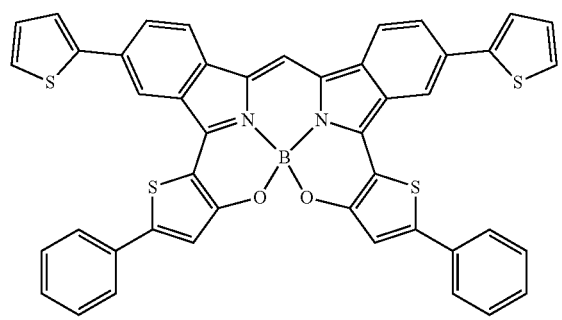
(1-63)
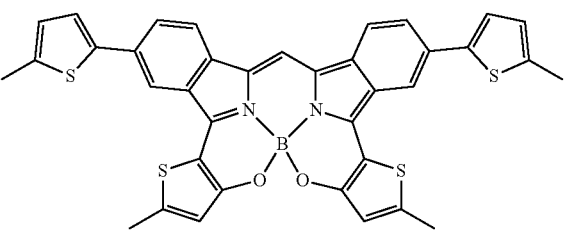
(1-64)
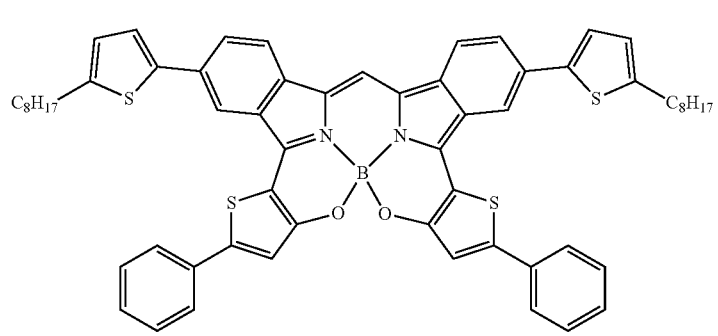

-continued
(1-65)
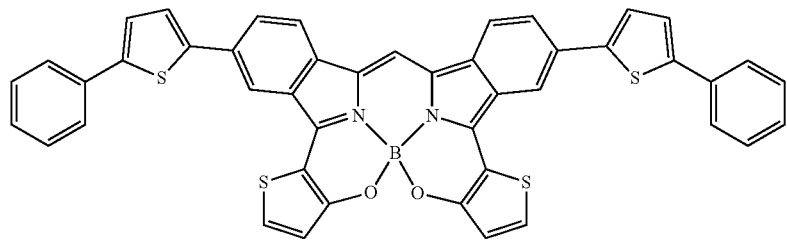
(1-66)
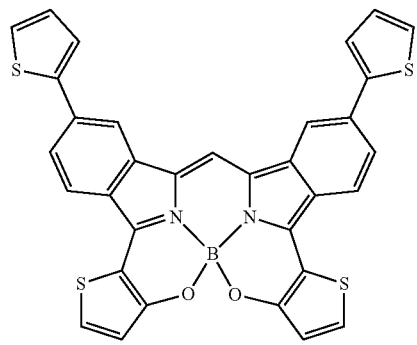
(1-67)
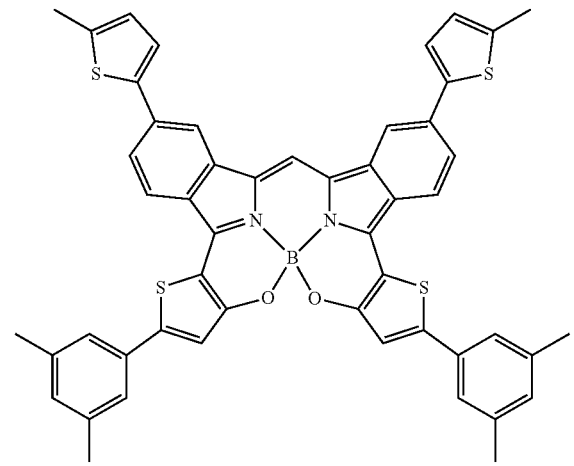
(1-68)
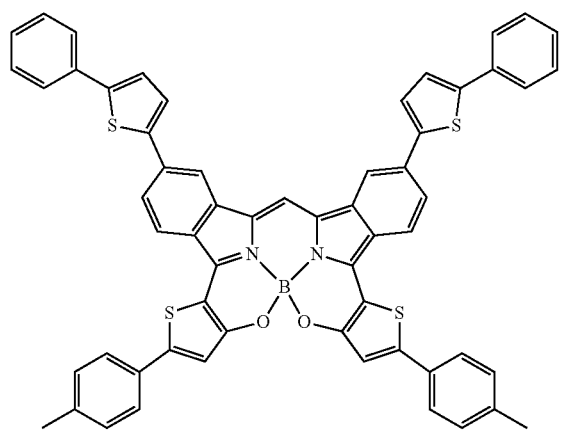
(1-69)
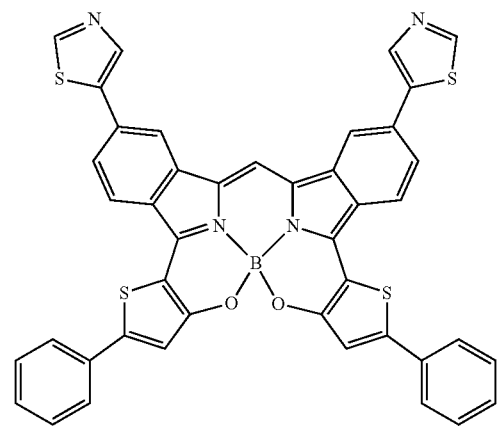
(1-70)
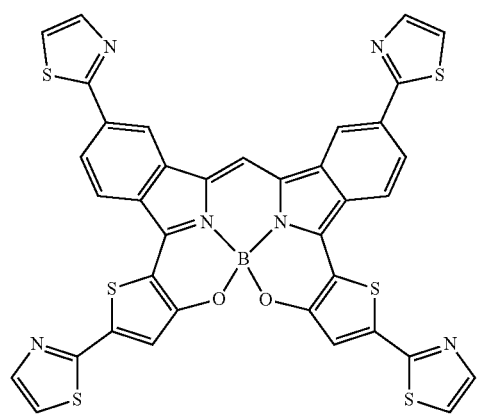
(1-71)
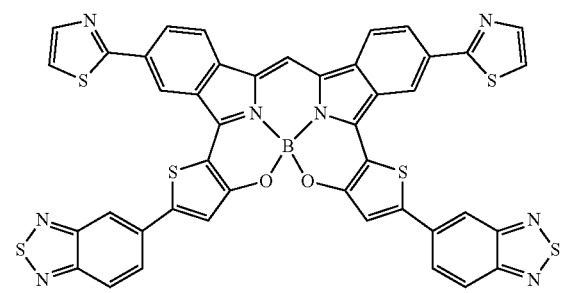

-continued
(1-72)
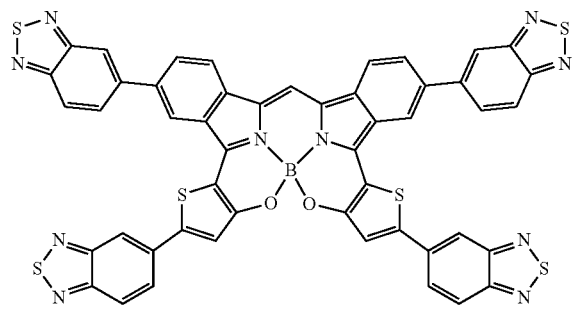
(1-73)
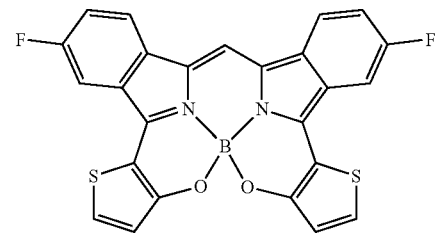
(1-74)
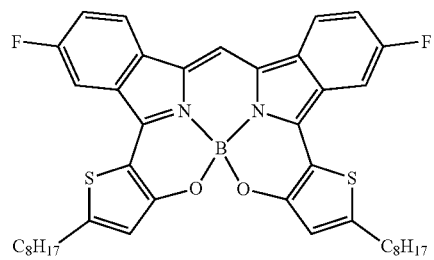
(1-75)
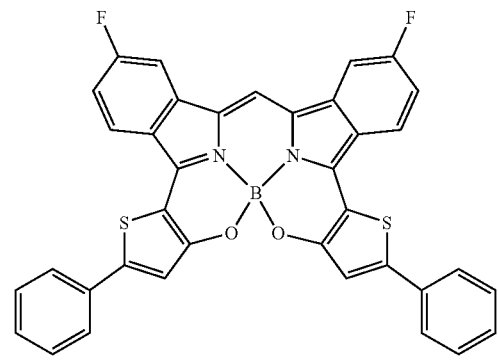
(1-76)
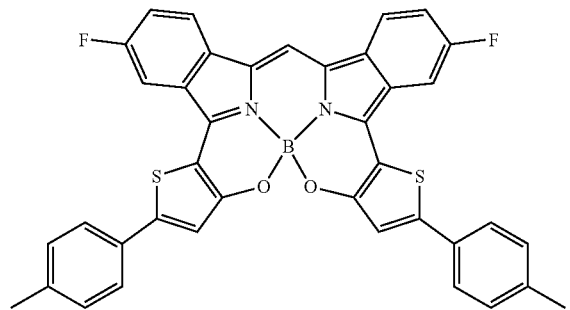
(1-77)
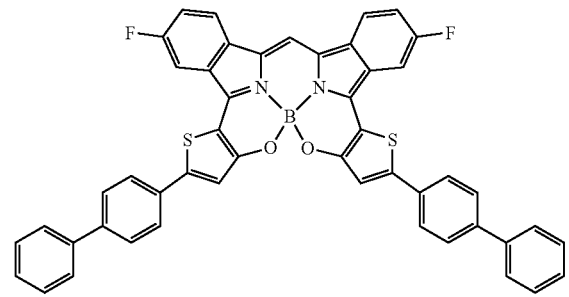
(1-78)
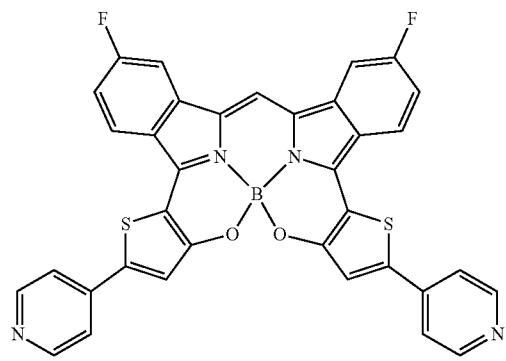
(1-79)
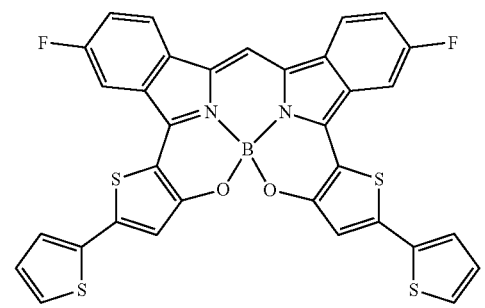

(1-80) 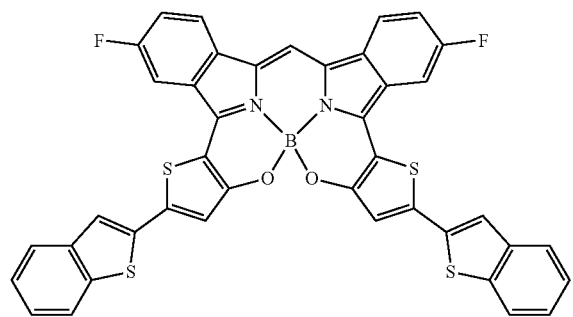
(1-81) 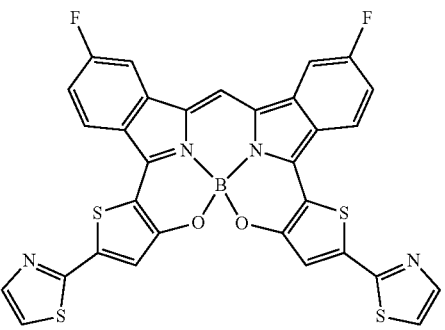
(1-82) 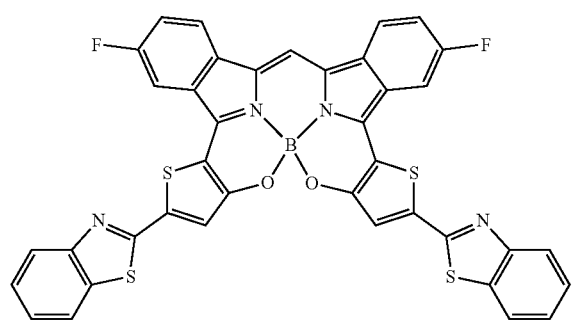
(1-83) 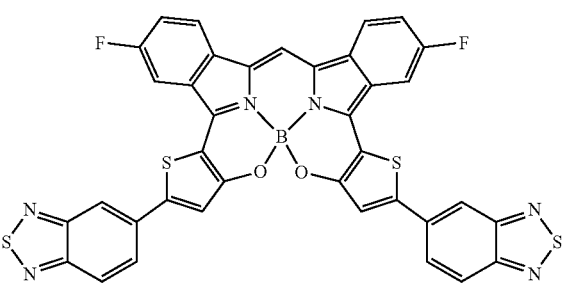
(1-84) 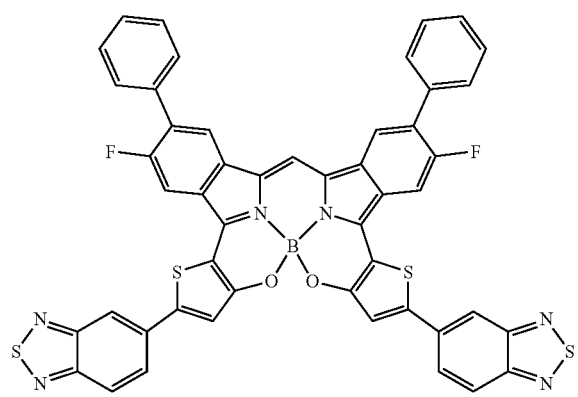
(1-85) 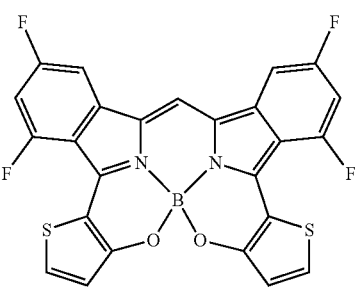
(1-86) 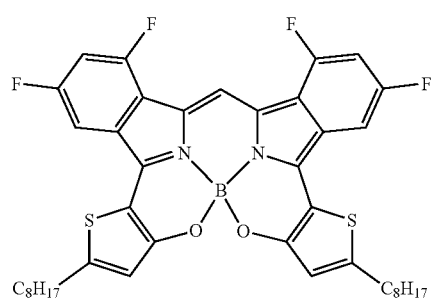
(1-87) 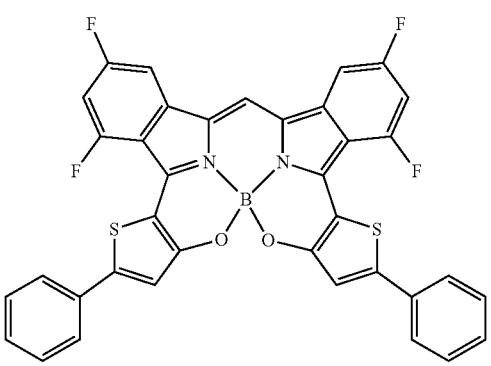

-continued
(1-88)
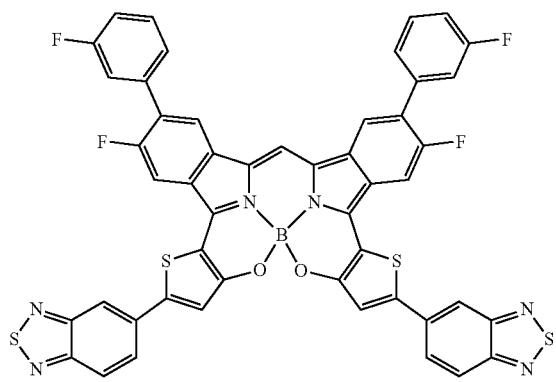
(1-89)
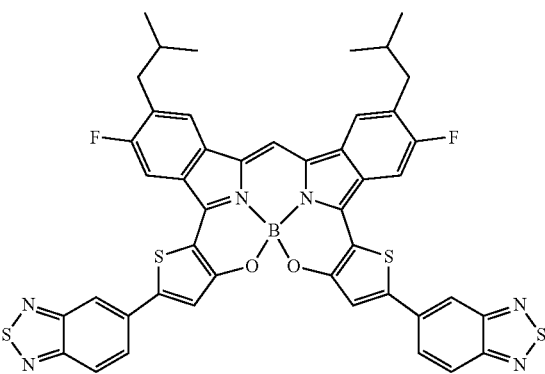
(1-90)
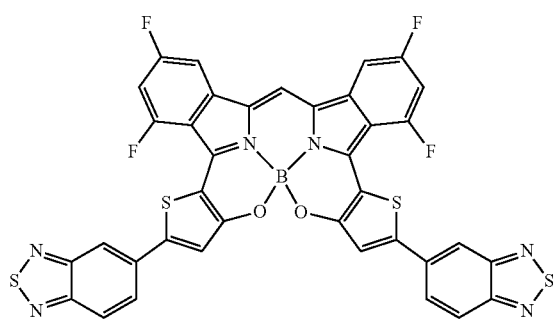
(1-91)
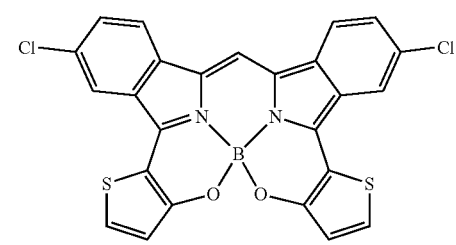
(1-92)
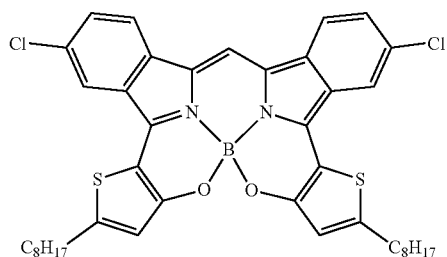
(1-93)
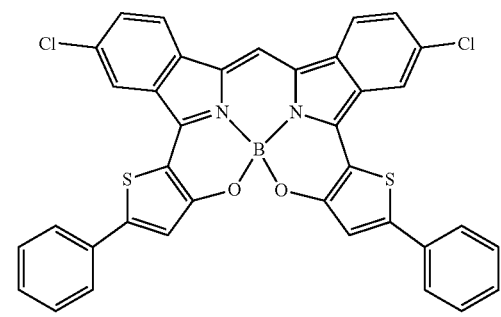
(1-94)
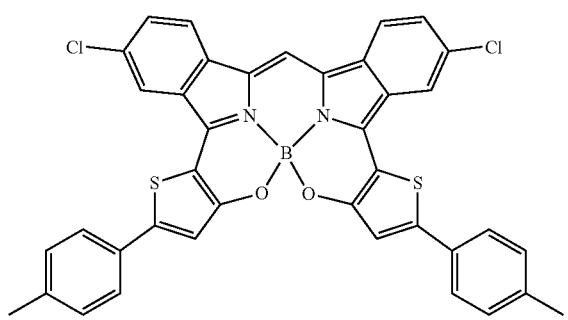
(1-95)
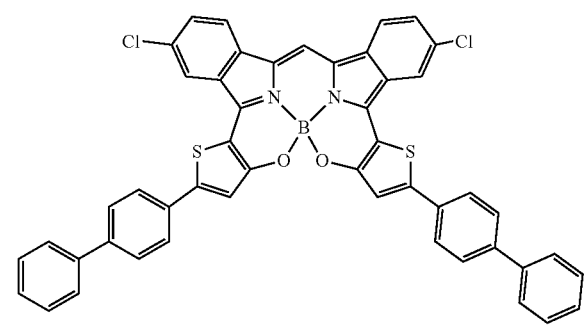

-continued
(1-96)
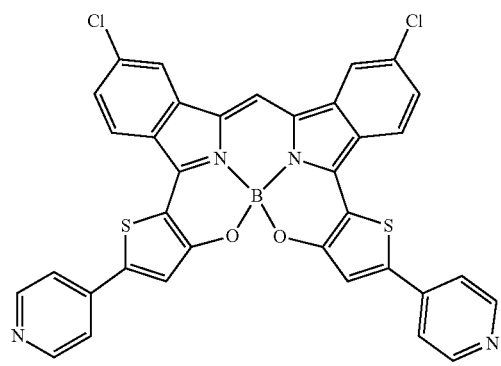
(1-97)
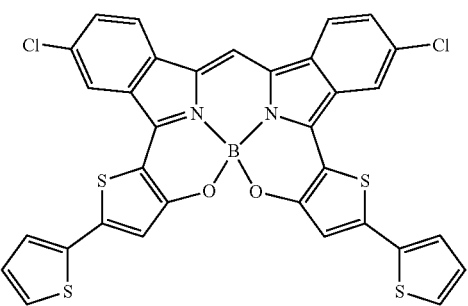
(1-98)
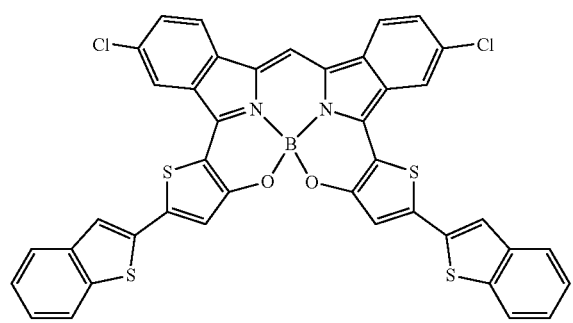
(1-99)
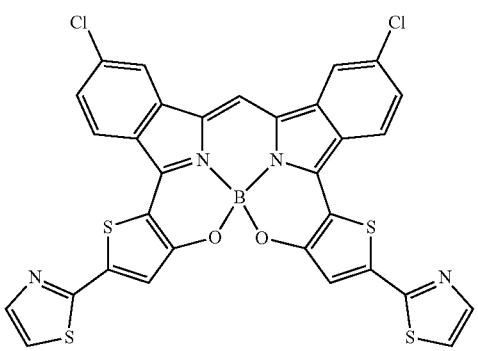
(1-100)
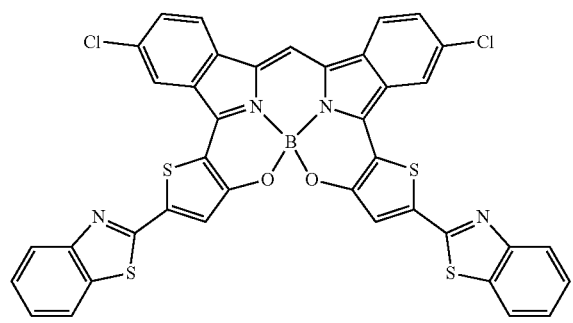
(1-101)
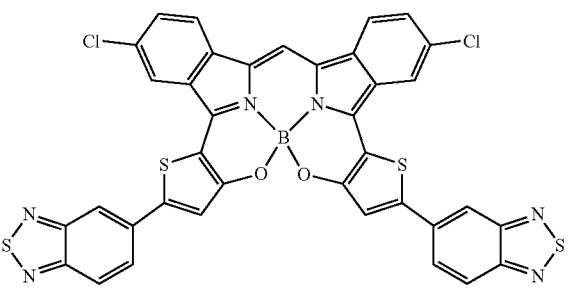
(1-102)
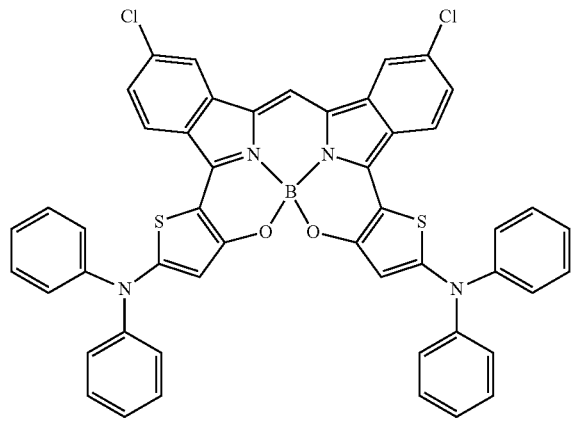
(1-103)
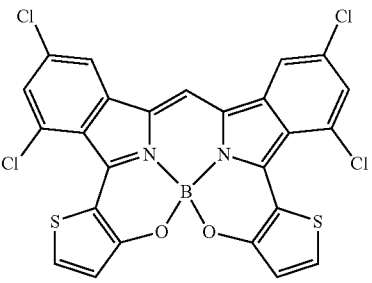

(1-104)
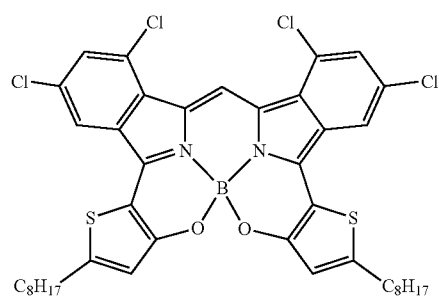
(1-105)
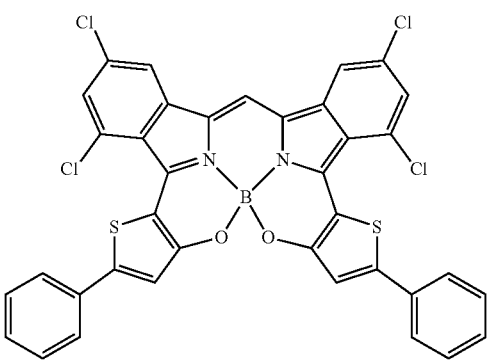
(1-106)
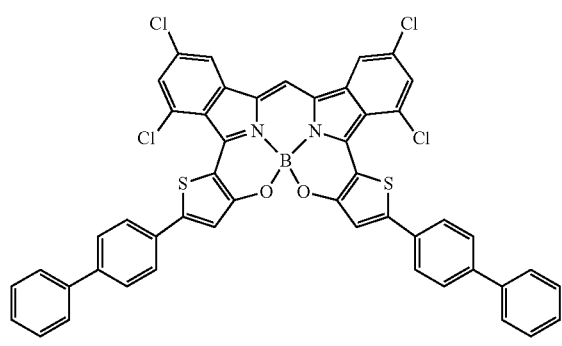
(1-107)
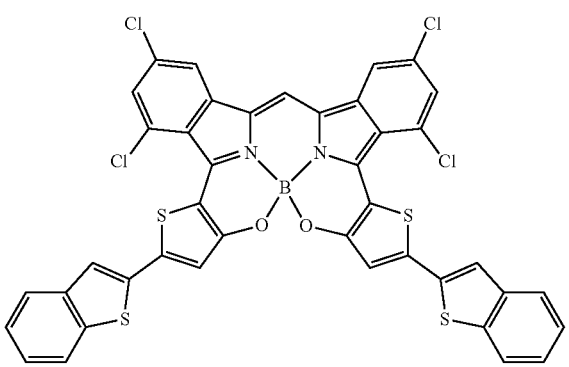
(1-108)
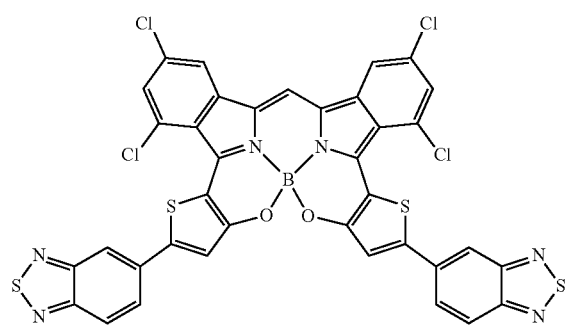
(1-109)
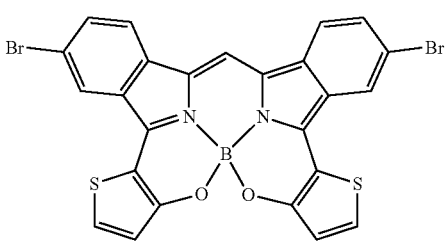
(1-110)
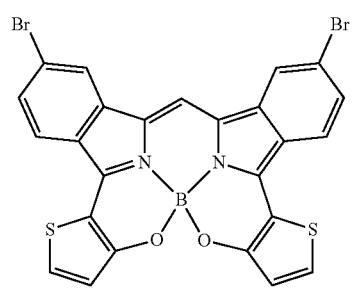
(1-111)
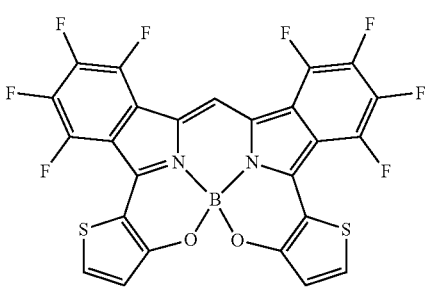

-continued
(1-112)
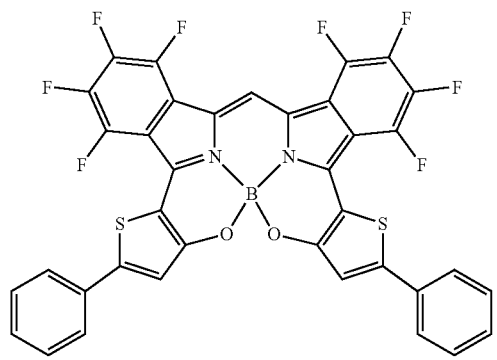
(1-113)
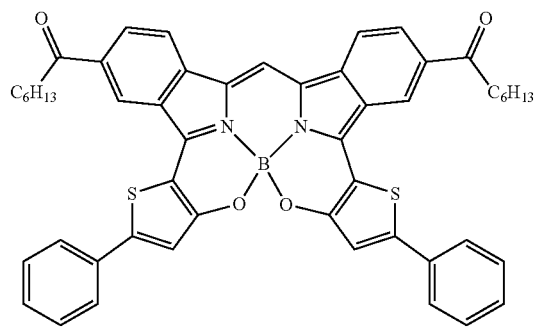
(1-114)
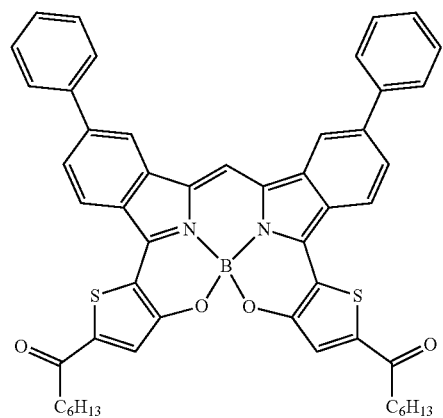
(1-115)
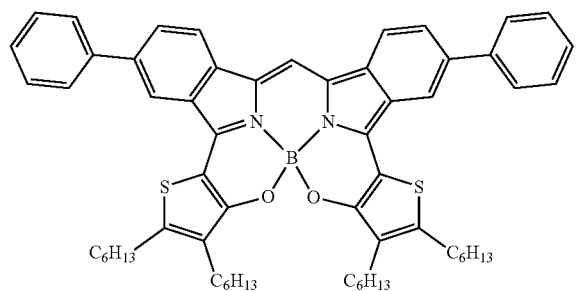
(1-116)
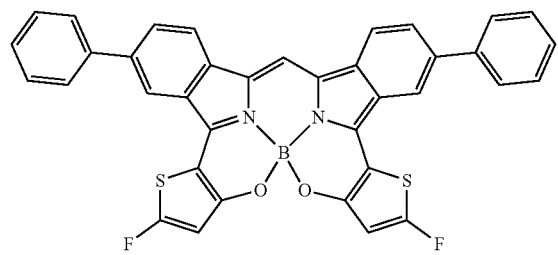
(1-117)
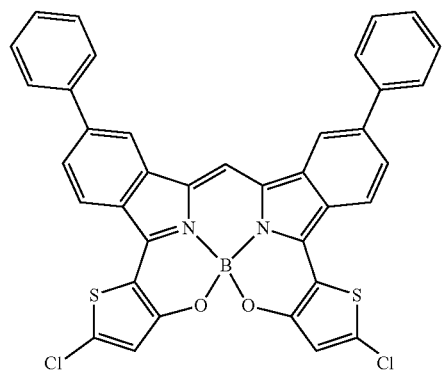
(1-118)
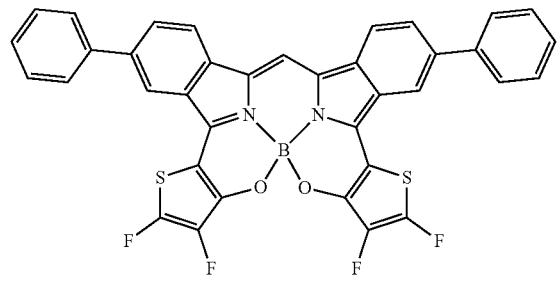
(1-119)
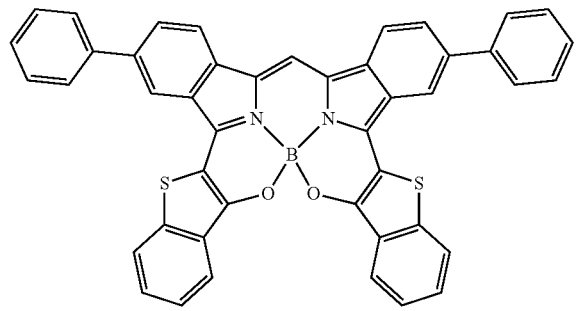

(1-120)
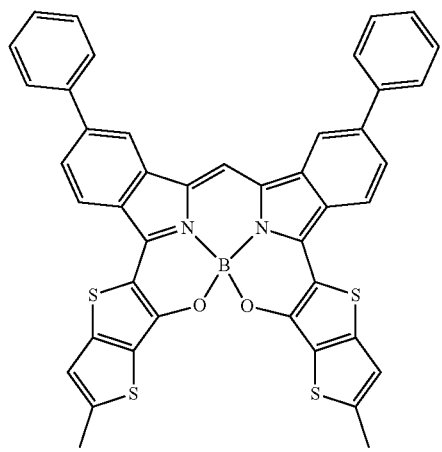
(1-121)
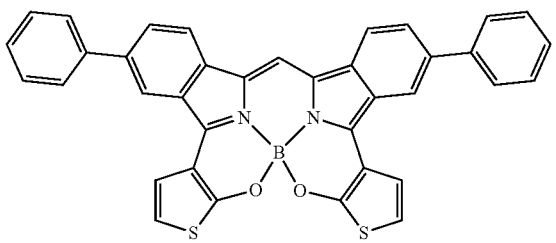
(1-122)
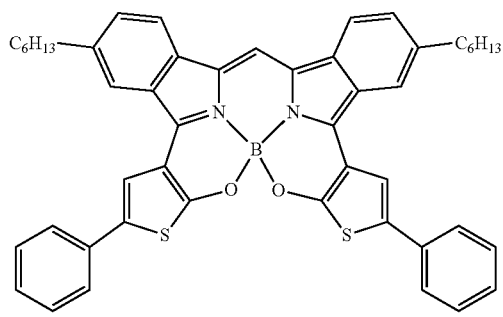
(1-123)
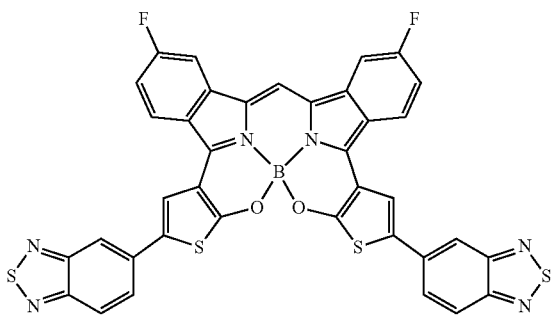
(1-124)
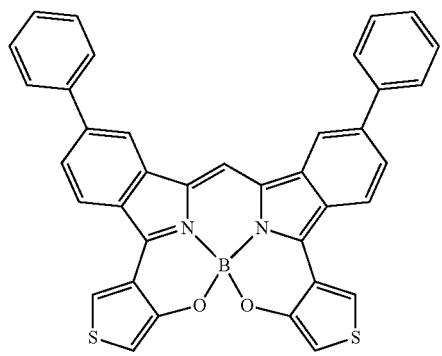
(1-125)
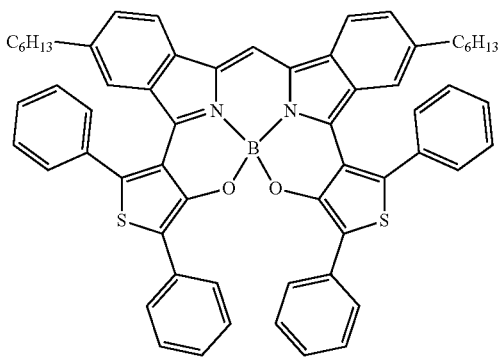
(1-126)
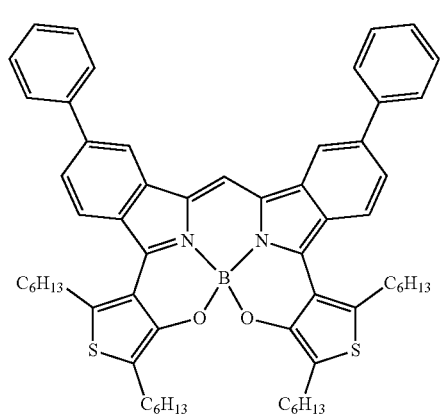

The near-infrared light absorbing material of the present invention contains the compound represented by the above formula (1).

The content of the compound represented by the formula (1) in the near-infrared light absorbing material of the present invention is not particularly limited as long as the near-infrared light absorbing properties required in the application using the near-infrared light absorbing material is exhibited, but is usually 50% by mass or more, preferably 80% by mass or more, more preferably 90% by mass or more, and further preferably 95% by mass or more.

Compounds other than the compound represented by the formula (1) (e.g., near-infrared light absorbing materials (dyes) other than the compound represented by the formula (1)) and additives may be used in combination with the near-infrared light absorbing material of the present invention. The compounds or the additives which may be used together are not particularly limited, as long as the near-infrared light absorbing properties required in the application using the near-infrared light absorbing material is exhibited.

The thin film of the present invention contains the near-infrared light absorbing material of the present invention.

The thin film of the present invention can be produced by general dry film formation methods or general wet film formation methods. Specifically, vacuum processes such as resistance heating vapor deposition, electron beam vapor deposition, sputtering, and molecular lamination, solution processes such as casting, coating methods such as spin coating, dip coating, blade coating, wire bar coating, wire coating, and spray coating, printing methods such as ink jet printing, screen printing, offset printing, and letterpress printing, and soft lithography methods such as microcontact printing.

For the formation of the general thin film of the near-infrared light absorbing material, a process including applying a compound in a solution state is desired from the viewpoint of ease of processing. However, for the organic electronics device in which the organic films are laminated, the solution state is not suitable because the application solution may exude to the underlying organic film.

In order to realize such a laminated structure, the material which is capable of being vapor deposited, and which can be used for, for example, dry film formation methods such as resistance heating vapor deposition is suitable. Therefore, the near-infrared light absorbing material which has a main absorption wavelength in the near-infrared region, and which is capable of being vapor deposited is preferable as a near-infrared photoelectric conversion material.

For the film formation of each layer, a method in which the multiple method described above are combined may be employed. The thickness of each layer cannot be limited because the thickness of each layer depends on the resistance value/charge mobility of material. The thickness of each layer is usually in the range of 0.5 to 5000 nm, preferably in the range of 1 to 1000 nm, and more preferably in the range of 5 to 500 nm.

The molecular weight of the compound represented by the above formula (1) is preferably 1500 or less, more preferably 1200 or less, further preferably 1000 or less, for example, when the organic layer containing the compound represented by the above formula (1) which is formed by vapor deposition and is used. The lower limit of the molecular weight is the lowest possible molecular weight of the formula (1).

The compound represented by the formula (1) may be formed into the film by the application method regardless of the molecular weight. The film formation can be conducted by the application method even when the compound has a relatively large molecular weight.

The molecular weight in the present specification means the value calculated by the EI-GCMS method.

[Organic Electronics Device]

The organic electronics device of the present invention includes the thin film of the present invention (hereinafter, thin film may be referred to as "organic thin film"). As an organic electronics device, examples include an organic thin film transistor, an organic photoelectric conversion element, an organic solar cell element, an organic electroluminescent element (hereinafter referred to as "organic EL element" or "organic luminescent element"), an organic luminescent transistor element, and an organic semiconductor laser element. The present invention forces on the organic photoelectric conversion element and the organic EL element which is expected to be developed for the applications using the near-infrared light. The near-infrared organic photoelectric conversion element using the near-infrared light absorbing material, the organic EL element utilizing the near-infrared luminescent properties, and the organic semiconductor laser element, which are the embodiments of the present invention, will be described here.

Near-infrared light greater than 700 nm has high permeability to the living tissue. Therefore, because the use for in-vivo tissue observation can be performed, the near-infrared light can be applied in various embodiments depending on the purpose, for example, pathologic elucidation and diagnosis such as near-infrared fluorescent probe in the medical field.

[Organic Photoelectric Conversion Element]

The compound represented by the formula (1) is a compound having the near-infrared light absorption properties, so utilization as a near-infrared organic photoelectric conversion element is expected. In particular, the compound represented by the formula (1) described above can be used for the photoelectric conversion layer in the organic photoelectric conversion element of the present invention. In the element, the maximum absorption in the absorption band of the response wavelength to light is preferably 700 to 2500 nm. Examples of the near-infrared organic photoelectric conversion element include a near-infrared light sensor, an organic imaging element, and a near-infrared light imaging sensor.

In the present specification, the term "maximum absorption in the absorption band" means the value of the wavelength at which the absorbance is maximum in the absorbance spectrum measured by the absorption spectrum measurement, and the term "maximum absorption wavelength ($\lambda$max)" means the maximum absorption on the longest wavelength in the maximum absorptions.

The organic photoelectric conversion element is an element in which a photoelectric conversion part (film) is disposed between an electrode film and an opposing electrode film, and light enters the photoelectric conversion part from above the electrode film. The photoelectric conversion part generates electrons and holes in response to the light which enters. In the photoelectric conversion element, a signal corresponding to the charge is read by the semiconductor, and the incident light amount is shown according to the absorption wavelength of the photoelectric conversion part. In some cases, a transistor for readout is connected to the electrode film on the side where light does not enter. When a large number of the organic photoelectric conversion elements are arranged in the array, the incident position information is provided in addition to the incident light amount, therefore, the organic photoelectric conversion elements arranged in the array form an image element. Moreover, when the photoelectric conversion element arranged closer to the light source does not shield light having the absorption wavelength absorbed by the photoelectric conversion element arranged behind as viewed from the light source side, a plurality of photoelectric conversion elements may be laminated and used.

The organic photoelectric conversion element of the present invention uses the compound represented by the formula (1) as a component of the photoelectric conversion part.

The photoelectric conversion part is often composed of a photoelectric conversion layer and one or more of the organic thin layer other than the photoelectric conversion layer selected from the group consisting of an electron transport layer, a hole transport layer, an electron block layer, a hole block layer, a crystallization prevention layer, and an interlayer contact improvement layer, etc. Although the compound of the present invention can also be used for a layer other than the photoelectric conversion layer, the compound is preferably used for an organic thin film layer of the photoelectric conversion layer. The photoelectric conversion layer may be composed of only the compound represented by the formula (1), the photoelectric conversion layer may include conventional near-infrared light absorbing materials and others in addition to the compound represented by the formula (1).

The electrode film used in the organic photoelectric conversion element of the present invention plays a role of taking out the holes from the photoelectric conversion layer or other organic thin film layers, and collecting the holes, when the photoelectric conversion layer which is included in the photoelectric conversion part described later has hole transportability or when an organic thin film layer other than the photoelectric conversion layer is a hole transport layer having hole transportability. Alternatively, the electrode film plays a role of taking out the electrons from the photoelectric conversion layer and other organic thin film layers and discharging the electrons, when the photoelectric conversion layer which is included in the photoelectric conversion part has electron transportability or when an organic thin film layer other than the photoelectric conversion layer is an electron transport layer having electron transportability.

Therefore, the material which can be used as an electrode film is not particularly limited as long as the material has a certain degree of conductivity, but is preferably selected in view of the adhesion with the adjacent photoelectric conversion layer and the other organic thin film layer, the electron affinity, the ionization potential, the stability, etc. As a material which can be used as an electrode film, examples include conductive metal oxides such as tin oxide (NESA), indium oxide, indium tin oxide (ITO), and indium zinc oxide (IZO); metals such as gold, silver, platinum, chromium, aluminum, iron, cobalt, nickel, and tungsten; inorganic conductive substances such as copper iodide and copper sulfide; conductive polymers such as polythiophene, polypyrrole, and polyaniline; carbon. These materials may be mixed and used, or the electrode films made of different materials may be laminated in two or more layers and used, as necessary. The conductivity of the material used for the electrode film is not particularly limited as long as the light reception of the photoelectric conversion element is not disturbed overly, but is preferably as high as possible from the viewpoint of the signal strength and the power consumption of the photoelectric conversion element. For example, an ITO film having conductivity of the sheet resistance value of $300\Omega/\square$ or less functions sufficiently as an electrode film, but because a substrate having ITO film having conductivity of about several $\Omega/\square$ is also commercially available, the substrate having such high conductivity is desirably used. The thickness of the ITO film (electrode film) can be appropriately selected in consideration of the conductivity, but is usually about 5 to 500 nm, preferably about 10 to 300 nm. Examples of the method for the film formation such as an ITO film include a vapor deposition method, an electron beam method, a sputtering method, a chemical reaction method, and an application method which are conventionally used. The ITO film provided on the substrate may be subjected to a UV-ozone treatment, a plasma treatment or the like, as necessary.

Examples of the material of the transparent electrode film used for at least one of the electrode films on the light incident side include ITO, IZO, $SnO_2$, ATO (antimony-doped tin oxide), ZnO, AZO (Al-doped zinc oxide) GZO (gallium-doped zinc oxide), $TiO_2$, FTO (fluorine-doped tin oxide), etc. The transmittance of the light entering through the transparent electrode film at the peak of the absorption wavelength of the photoelectric conversion layer is preferably 60% or more, more preferably 80% or more, and particularly preferably 95% or more.

When a plurality of photoelectric conversion layers having different wavelengths to be detected are laminated, the electrode film used between each photoelectric conversion layer, which is an electrode film other than the pair of electrode films described above is necessary to transmit light other than light having a wavelength to be detected by each photoelectric conversion layer, and the material used for the electrode film preferably has transmittance of 90% or more of incident light, and more preferably 95% or more of incident light.

The electrode film is preferably formed by plasma-free conditions. By forming these electrode films with plasma-free conditions, the influence of the plasma on the substrate on which the electrode film is provided can be reduced, and the photoelectric conversion properties of the photoelectric conversion element can be improved. In this specification, the term "plasma-free conditions" means conditions in which plasma is not used for the film formation of the electrode film, or a state in which the plasma reaching the substrate is reduced by providing the distance from the plasma source to the substrate by 2 cm or more, preferably 10 cm or more, and more preferably 20 cm or more.

Examples of apparatus using no plasma during the film formation of the electrode film (hereinafter, referred to as "plasma-free film formation apparatus") include an electron beam vapor deposition apparatus (EB vapor deposition apparatus) and a pulse laser vapor deposition apparatus. A method for formation of the transparent electrode film using the EB vapor deposition apparatus is referred to as "EB vapor deposition method", and a method for formation of the transparent electrode film using the pulse laser vapor deposition apparatus is referred to as "pulse laser vapor deposition method".

As an apparatus which is capable of realizing a state in which the plasma is reduced during the film formation (hereinafter, referred to as plasma-free film formation apparatus), for example, a facing target sputtering apparatus, an arc plasma deposition apparatus, etc. can be considered.

When the transparent conductive film is used as an electrode film (for example, the first conductive film), DC shorting or an increase in the leakage current may occur. One of the reasons is considered to be that fine cracks generated in the photoelectric conversion layer are covered with a dense film such as TCO (transparent conductive oxide), and the conduction between the electrode film on the opposite side to the first conductive film (second conductive film) is increased. Therefore, when the material which is inferior in film quality such as Al is used for the electrode, the increase of the leakage current unlikely occurs. The increase in the leakage current can be suppressed by controlling the film thickness of the electrode film depends on the film thickness of the photoelectric conversion layer (depth of crack).

Usually, when the conductive film is thinner than a certain thickness, a rapid increase in resistance occurs. The sheet resistance of the conductive film in the photoelectric conversion element for an optical sensor which is one of the embodiments is usually 100 to 10000Ω/□, and the film thickness can be set appropriately. In addition, the thinner the transparent conductive film is, the less light is absorbed, therefore the light transmittance generally becomes higher. When the light transmittance is high, light absorbed by the photoelectric conversion layer is increased to provide improved photoelectric conversion ability, which is preferable.

The photoelectric conversion part included in the organic photoelectric conversion element of the present invention may include a photoelectric conversion layer and an organic thin film layer other than the photoelectric conversion layer. An organic semiconductor film is generally used for the photoelectric conversion layer constituting the photoelectric conversion part. The organic semiconductor film may be a single layer or made of multilayer. In the case of the single layer, a p-type organic semiconductor film, an n-type organic semiconductor film, or a mixed film thereof (bulk hetero structure) can be used. On the other hand, in the case of multilayer, the number of layers is about 2 to 10, and a structure in which the p-type organic semiconductor film, the n-type organic semiconductor film, and/or the mixed film thereof (bulk hetero structure) are laminated, and a buffer layer may be inserted between the layers. When the photoelectric conversion layer is formed of the mixed film, the compound represented by the general formula (1) of the present invention is preferably used as a p-type semiconductor material, and a general fullerene or the derivative thereof is used as an n-type semiconductor material.

In the organic photoelectric conversion element of the present invention, the organic thin film layer other than the photoelectric conversion layer constituting the photoelectric conversion part is used as a layer other than the photoelectric conversion layer, for example, an electron transport layer, a hole transport layer, an electron block layer, a hole block layer, a crystallization prevention layer, an interlayer contact improvement layer, etc. In particular, by using the organic thin film layer as a thin film layer of one or more selected from the group consisting of the electron transport layer, the hole transport layer, the electron block layer and the hole block layer (hereinafter also referred to as "carrier block layer") is preferable, because an element in which light energy efficiently converts into an electric signal can be obtained even when light energy is weak.

In addition, in the organic imaging element, a method of inserting the carrier block layer into the layer structure is preferable, because the performance relating to high contrast and power saving are generally considered to be improved by reducing dark current. These carrier block layers are generally used in the field of the organic electronics devices, and each have a function of controlling reverse movement of the holes or the electrons in the films constituting the device.

The electron transport layer plays a role of transporting the electrons generated in the photoelectric conversion layer to the electrode film and a role of blocking transport of the holes from the electrode film, which is the electron transport destination, to the photoelectric conversion layer. The hole transport layer plays a role of transporting the generated holes from the photoelectric conversion layer to the electrode film and a role of blocking transport of the electrons from the electrode film, which is the hole transport destination, to the photoelectric conversion layer. The electron block layer plays a role of preventing the transporting of the electrons from the electrode film to the photoelectric conversion layer, and preventing recombination in the photoelectric conversion layer to reduce the dark current. The hole block layer has a function of blocking transport of the holes from the electrode film to the photoelectric conversion layer, a function of preventing recombination in the photoelectric conversion layer, and a function of reducing the dark current.

Although the typical element structure of the organic photoelectric conversion element of the present invention is shown in FIG. 1, the present invention is not limited to this structure. In the embodiment of FIG. 1, 1 represents an insulation part, 2 represents one electrode film (upper electrode film), 3 represents an electron block layer, 4 represents a photoelectric conversion layer, 5 represents a hole block layer, 6 represents the other electrode film (lower electrode film), and 7 represents an insulation substrate or another organic photoelectric conversion element, respectively. Although no transistor for reading is shown in the drawing, the transistor only needs to be connected to the electrode film of 2 or 6. Further, if the photoelectric conversion layer 4 is transparent, the film may be formed on the outside of the electrode film on the side opposite to the light incident side. The incidence direction of light on the organic photoelectric conversion element may be from either the upper part or the lower part as long as the components excluding the photoelectric conversion layer 4 do not largely inhibit the incidence of light of the main absorption wavelength of the photoelectric conversion layer.

[Organic EL Element]

Next, an organic EL element will be described.

Because the compound represented by the general formula (1) of the present invention is a compound having the near-infrared luminescent property, therefore the compound is expected to use as an organic EL element.

The organic EL element attracts attention in terms of being capable of using in a solid state for applications such as self-luminous large-area color displays and illuminations, and many developments have been made. The structure thereof is known to be structures such as a structure having two layers of a luminescent layer and a charge transport layer between the counter electrodes consisting of a negative electrode and a positive electrode; a structure having three layers of an electron transport layer, a luminescent layer and a hole transport layer laminating between the counter electrodes consisting of the negative electrode and the positive electrode; a structure having three or more layers; and structures in which luminescent layer is a single layer is also known.

In the specification, the hole transport layer has a function of injecting the hole from the positive electrode, and transporting the hole to the luminescent layer to facilitate the injection of the hole to the luminescent layer and a function of blocking the electron. The electron transport layer has a function of injecting the electron from the negative electrode, and transporting the electron to the luminescent layer to facilitate the injection of the electron to the luminescent layer and a function of blocking the hole. Furthermore, in the luminescent layer, an exciton is generated by recombination of the electron and the hole which are each injected, and energy emitted due to the exciton radiation deactivation is detected as luminescence. The preferable embodiment of the organic EL element is described below.

The organic EL element is an element in which one or more layers of the organic thin film are formed between the electrodes of the positive electrode and the negative electrode, and is an element emitting light by electric energy.

The positive electrode which can be used in the organic EL element is an electrode having a function of injecting the hole to the hole injection layer, the hole transport layer, and the luminescent layer. In general, materials such as metal oxides, metals, alloys, conductive materials which have a work function of 4.5 eV or more are suitable. Specifically, the material which is suitable for the positive electrode of the organic EL element is not particularly limited, but examples include conductive metal oxides such as tin oxide (NESA), indium oxide, indium tin oxide (ITO) and indium zinc oxide (IZO), metals such as gold, silver, platinum, chromium, aluminum, iron, cobalt, nickel, and tungsten, inorganic conductive substances such as copper iodide and copper sulfide, conductive polymers such as polythiophene, polypyrrole, and polyaniline and carbon. Among them, ITO or NESA is preferable to use.

The positive electrode may be mixed with two or more materials and used, or may be composed of two or more layers of different materials, as necessary. The resistance of the positive electrode is not limited as long as the sufficient current for luminescence of the element can be supplied, but a low resistance is preferable from the viewpoint of the power consumption of the element. For example, an ITO substrate having a sheet resistance value of 300Ω/□ or less functions as an element electrode, but a low resistance product is desirable to use because a substrate having several values of Ω/□ is also possible to be supplied. The thickness of the ITO can be appropriately selected according to the resistance value, but is usually in the range of 5 to 500 nm, preferably 10 to 300 nm. Examples of the formation methods for the film such as ITO include a vapor deposition method, an electron beam method, a sputtering method, a chemical reaction method and an application method.

The negative electrode which can be used in the organic EL element is an electrode having a function of injecting an electron to the electron injection layer, the electron transport layer, and the luminescent layer. In general, materials such as metals and alloys which having a small work function (approximately 4 eV or less) are suitable. Specific examples include platinum, gold, silver, copper, iron, tin, zinc, aluminum, indium, chromium, lithium, sodium, potassium, calcium, and magnesium, but lithium, sodium, potassium, calcium, and magnesium are preferable in order to increase the electron injection efficiency to improve the electron properties. As an alloy, the alloy containing the metals with a low work function such as aluminum or silver, or the electrode having a structure which laminated thereof can be used. The inorganic salt such as lithium fluoride can be used for the electrode of the laminated structure. In the case where luminescence is extracted not to the positive electrode side but to the negative electrode side, the negative electrode may be a transparent electrode which is capable of the film formation at low temperature. Examples of the method for formation of the negative electrode film include a vapor deposition method, an electron beam method, a sputtering method, a chemical reaction method, and an application method, but the method is not particularly limited. The resistance of the negative electrode is not limited as long as the sufficient current for luminescence of the element can be supplied, but the resistance is preferably low from the viewpoint of the power consumption of the element, and is preferably several hundreds to several Ω/□. The film thickness of the negative electrode is usually in the range of 5 to 500 nm, preferably in the range of 10 to 300 nm.

The negative electrode can be protected with oxides such as titanium oxide, silicon nitride, silicon oxide, silicon nitride oxide, and germanium oxide, nitrides or mixtures thereof, polyvinyl alcohol, vinyl chloride, hydrocarbon polymers, fluorine polymers, and can be sealed together with dehydrating agents such as barium oxide, phosphorus pentoxide, and calcium oxide.

In order to extract luminescence, generally, forming an electrode on a substrate having sufficient transparency in an emission wavelength region of an element is preferable. Examples of the transparent substrates include a glass substrate and a polymer substrate. As a glass used for a glass substrate, examples include soda lime glass, non-alkali glass, quartz, and the thickness may be sufficient for maintaining mechanical and thermal strength, and is preferably 0.5 mm or more. As for the material of the glass, a glass where less ions are eluted from the glass is preferable, and non-alkali glass is more preferable. As such materials, soda lime glass having a barrier coating of $SiO_2$ and the like is commercially available, which can also be used. In addition, examples of substrates which is made of polymers other than the glass include polycarbonate, polypropylene, polyether sulfone, polyethylene terephthalate, and acrylic substrates.

The organic thin film of the organic EL element is formed of one or more layers between the electrodes of the positive electrode and the negative electrode. An element capable of emitting light by electric energy can be obtained by containing the compound represented by the above general formula (1) in the organic thin film.

The "layer" which formed of the organic thin film means a single layer providing the functions possessed by layers such as a hole transport layer, an electron transport layer, a hole transportable luminescent layer, an electron transportable luminescent layer, a hole block layer, an electron block layer, a hole injection layer, an electron injection layer, a luminescent layer, or a structural example 9) as below. As a structure of the layer which forms the organic thin film in the present invention, examples include the following structural examples 1) to 9), and any structure thereof may be used.

STRUCTURAL EXAMPLES

1) Hole transport layer/Electron transportable luminescent layer.
2) Hole transport layer/Luminescent layer/Electron transport layer.
3) Hole transportable luminescent layer/Electron transport layer.
4) Hole transport layer/Luminescent layer/Hole block layer.
5) Hole transport layer/Luminescent layer/Hole block layer/Electron transport layer.
6) Hole transportable luminescent layer/Hole block layer/Electron transport layer.
7) In each of the combinations of 1) to 6) described above, a hole injection layer is further provided in front of the hole transport layer or the hole transportable luminescent layer.
8) In each of the combinations 1) to 7) described above, the electron injection layer is further provided in front of the electron transport layer or the electron transport luminescent layer.

9) Structure having single layer containing mixed material obtained by mixing materials used in the combination of 1) to 8) described above.

In the above 9), the structure may be a single layer formed of a material generally called as a bipolar luminescent material; or a single layer containing a luminescent material and a hole transport material or an electron transport material. In general, a multilayer structure can efficiently transport charges, i.e., holes and/or electrons, and recombine the charges. The stability of the element can be prevented from lowering and the efficiency of luminescence can be improved by suppressing the charge quenching, etc.

The hole injection layer and the hole transport layer are formed by laminating a hole transport material alone or a mixture of two or more of the materials. As a hole transport material, examples which can be used preferably include triphenylamines such as N,N'-diphenyl-N,N'-di(3-methylphenyl)-4,4"-diphenyl-1,1'-diamine and N,N'-dinaphthyl-N,N'-diphenyl-4,4'-diphenyl-1,1'-diamine; bis(N-allylcarbazole) or bis(N-alkylcarbazole); heterocyclic compounds represented by pyrazoline derivatives, stilbene based compounds, hydrazone based compounds, triazole derivatives, oxadiazole derivatives, and porphyrin derivatives; and polymers such as polycarbonates, styrene derivatives polyvinylcarbazole or polysilane, etc. having the monomer mentioned above in the side chain. The hole transport material is not particularly limited as long as the material can form a thin film necessary for element producing, inject the hole from the electrode, and further transport the hole. Examples of the hole injection layer provided between the hole transport layer and the positive electrode for improving the hole injection properties include phthalocyanine derivatives, starburst amines such as m-MTDATA (4,4',4"-tris[phenyl(m-tolyl)amino] triphenylamine), etc., and such as polymers, polythiophenes e.g., PEDOT (poly(3,4-ethylenedioxythiophene)), polyvinyl carbazole derivatives, etc.

The electron transport layer is formed by laminating an electron transport material alone or a mixture of two or more of the materials. The electron transport material is necessary to efficiently transport electrons from the negative electrode between the electrodes in an electric field. The electron transport material preferably has a high electron injection efficiency and efficiently transports the injected electron. For this purpose, the electron transport material is required to be a material having large electron affinity, large electron mobility, and high stability. Furthermore, the material is also required to be unlikely to generate trapping impurity during the manufacturing and the use. Examples of a material satisfying above conditions include quinolinol derivative metal complexes represented by tris(8-quinolinolato) aluminum complex, tropolone metal complex, perylene derivatives, perinone derivatives, naphthalimide derivatives, naphthalic acid derivatives, oxazole derivatives, oxadiazole derivatives, thiazole derivatives, thiadiazole derivatives, triazole derivatives, bisstyryl derivatives, pyrazine derivatives, phenanthroline derivatives, benzoxazole derivatives, and quinoxaline derivatives, but is not particularly limited thereto. These electron transport materials can be used alone, but may be used with laminating or mixing with the different electron transport materials. Examples of the electron injection layer provided between the electron transport layer and the negative electrode for improving the electron injection properties include metals such as cesium, lithium, and strontium, or lithium fluoride.

The hole block layer is formed by laminating or mixing a hole block material alone or two or more of materials. As a hole block material, phenanthroline derivatives such as bathophenanthroline and bathocuproine, silole derivatives, quinolinol derivative metal complexes, oxadiazole derivatives, oxazole derivatives, etc. are preferable. The hole block material is not particularly limited as long as the material is a compound which can prevent a hole flowing out of the element from the negative electrode side and reducing luminous efficiency.

The luminescent layer means an organic thin film which emit light, and can be said to be, for example, a hole transport layer, an electron transport layer, or a bipolar transport layer having strong luminescence. As long as the luminescent layer may be formed of a luminescent material (host material, dopant material, etc.), the luminescent layer may be either a mixture of the host material and the dopant material or the host material alone. Each of the host material and the dopant material may be one kind or a combination of multiple materials.

The dopant material may be contained in the host material either totally or partially. The dopant material may be either laminated or dispersed. Examples of the luminescent layer include the hole transport layer and the electron transport layer which mentioned above. Materials used for the luminescent layer include carbazole derivatives, anthracene derivatives, naphthalene derivatives, phenanthrene derivatives, phenyl butadiene derivatives, styryl derivatives, pyrene derivatives, perylene derivatives, quinoline derivatives, tetracene derivatives, perylene derivatives, quinacridone derivatives, coumarin derivatives, porphyrin derivatives, and phosphorescent metal complexes (Ir complex, Pt complex, Eu complex, etc.).

Methods for formation of the organic thin film of the organic EL element, generally, vacuum processes such as resistance heating vapor deposition, electron beam vapor deposition, sputtering, molecular layering method, solution processes such as casting, coating methods such as spin coating, dip coating, blade coating, wire bar coating, spray coating, printing methods such as inkjet printing, screen printing, offset printing, letterpress printing, soft lithography methods such as micro contact printing method, and further, methods where a plurality of these methods are mixed can be adopted. The thickness of each layer is not limited because the thickness of each layer depends on the resistance value and the charge mobility of each material, but is selected from the range of 0.5 to 5000 nm. The range of 1 to 1000 nm is preferable, and the range of 5 to 500 nm is more preferable.

Among the organic thin films constituting the organic EL element, by containing the compound which is represented by the above general formula (1) in a layer or multiple layer of thin films such as the luminescent layer, the hole transport layer, and the electron transport layer placed between the positive electrode and the negative electrode, an element having good luminous efficiency even with low electric energy can be obtained.

The compound represented by the above general formula (1) can be used suitably as an material for the hole transport layer, the luminescent layer and the electron transport layer. For example, the compound represented by the above general formula (1) can be used in combination or mixed with the electron transport materials, hole transport materials, luminescent materials, etc., which mentioned above.

When the compound represented by the above general formula (1) is used as a host material in combination with a dopant material, specific examples of the dopant material include perylene derivatives such as bis(diisopropylphenyl) perylenetetracarboxilic imide, perinone derivatives, 4-(dicyanomethylene)-2-methyl-6-(4-dimethylaminostyryl)-4H- pyran (DCM) and analogs thereof, metal phthalocyanine derivatives such as magnesium phthalocyanine and aluminum chlorophthalocyanine, rhodamine compounds, deazaflavin derivatives, coumarin derivatives, oxazine compounds, squarylium compounds, violanthrone compounds, nile red, pyrromethene derivatives such as 5-cyanopyrromethene-$BF_4$ complex, and further, as a phosphorescent material, porphyrins such as Eu complexes, Ir complexes, Ru complexes, Pt complexes and Os complexes, and ortho metal complexes having ligands such as acetylacetone, benzoylacetone, and phenanthroline can be used, but is not particularly limited thereto. In the case where two kinds of dopant materials are mixed, luminescence having improved color purity can be obtained by using the assist dopant such as rubrene in order to efficiently transfer energy from the host dye. In any cases, doping the material having a high fluorescence quantum yield is desirable to obtain the high luminance properties.

When the amount of the dopant material is too large, a concentration quenching phenomenon occurs, so the amount of dopant material is usually used at 30% by mass or less with respect to the host material. The amount of 20% by mass or less is preferably, the amount of 10% by mass or less is more preferably. As a method of doping the host material with the dopant material in the luminescent layer, co-evaporation with the host material can be used, but the dopant material may be premixed with the host material and vapor deposited simultaneously. Moreover, the dopant material can be also sandwiched between the host materials, and used. In this case, one or more dopant layers may be laminated with the host material.

These dopant materials may form each layer alone, or may be used in combination. The dopant material can be used as a polymer binder by dissolving or dispersing, solvent-soluble resins such as polyvinyl chloride, polycarbonate, polystyrene, polystyrene sulfonic acid, poly(N-vinylcarbazole), poly(methyl) (meth) acrylate, polybutyl methacrylate, polyester, polysulfone, polyphenylene oxide, polybutadiene, hydrocarbon resin, ketone resin, phenoxy resin, polysulfone, polyamide, ethyl cellulose, vinyl acetate, ABS resin (acrylonitrile-butadiene-styrene copolymer resin), and polyurethane resin, or curable resins such as phenol resin, xylene resin, petroleum resin, urea resin, melamine resin, unsaturated polyester resin, alkyd resin, epoxy resin, and silicone resin.

The organic EL element can be suitably used for a flat panel display. Moreover, the organic EL element can be also used for a flat back light, and in this case, the organic EL element can be used for any light of colored light and white light. The backlight is mainly used for the purpose of improving the visibility of the display device which does not spontaneously emit light, and are used for liquid crystal display devices, clocks, audio devices, automobile panels, display boards, signs, etc. In particular, in liquid crystal display devices, and among them, in conventional backlight for personal computers in which one of the problems is to make thinner, it is difficult to make thinner because the conventional backlight is composed of fluorescent lamps and light guide plates. However, the backlight using the luminescent element of the present invention has the properties relating to being thin and light weight advantageously, so the above problem is solved. Similarly, the backlight using the luminescent element of the present invention can be used for the illumination.

When the compound represented by the above general formula (1) of the present invention is used, the organic EL display device having high luminous efficiency and a long lifetime can be obtained. Furthermore, the organic EL display device in which on/off phenomenon of the applied voltage is electrically controlled with high precision can be supplied at low cost by combining a thin film transistor element.

[Organic Semiconductor Laser Element]

Because the compound represented by the above general formula (1) is a compound which has the near-infrared luminescent properties, utilization as an organic semiconductor laser element is expected. That is, if the density of the excited state can be sufficiently increased by efficiently injecting carriers in combination of the organic semiconductor laser element containing the compound represented by the above general formula (1) with a resonator structure, amplification of light expected to achieve laser oscillation. In the conventional organic semiconductor laser element, laser oscillation due to light excitation can be observed only, and generation of high density excitation state required for laser oscillation due to electric excitation has been said to be very difficult. However, the possibility of highly efficient luminescence (electroluminescence) is expected by using the organic semiconductor element containing the compound represented by the above general formula (1).

EXAMPLES

Hereinafter, the present invention will be described in detail by way of the Examples, but the present invention is not limited thereto. The structures of the compounds described in the synthesis examples were determined by the mass spectrometry and the nuclear magnetic resonance spectrum (NMR) as needed. The measurement of $^1$H NMR in the Examples was performed using JNM-ECS400 (JEOL Ltd.), the measurement of the molecular weight was performed using ISQ LT GC-MS (Thermo Fisher Scientific K.K.), and the measurement of the value of λmax of the absorption spectrum was performed using UV-1700 (Shimadzu Corporation). The measurement of current voltage application of the organic photoelectric conversion element was performed using PVL-3300 (Asahi Spectra Co., Ltd.) under the irradiation conditions of irradiation light intensity of 130 pW and half width of 20 nm, with using semiconductor parameter analyzer 4200-SCS (Keithley Instruments, Inc.) in the range of 350 to 1100 nm.

Example 1 (Synthesis of the Compound of the Present Invention)

A compound of the present invention represented by the formula (1-22) was synthesized according to the following scheme.

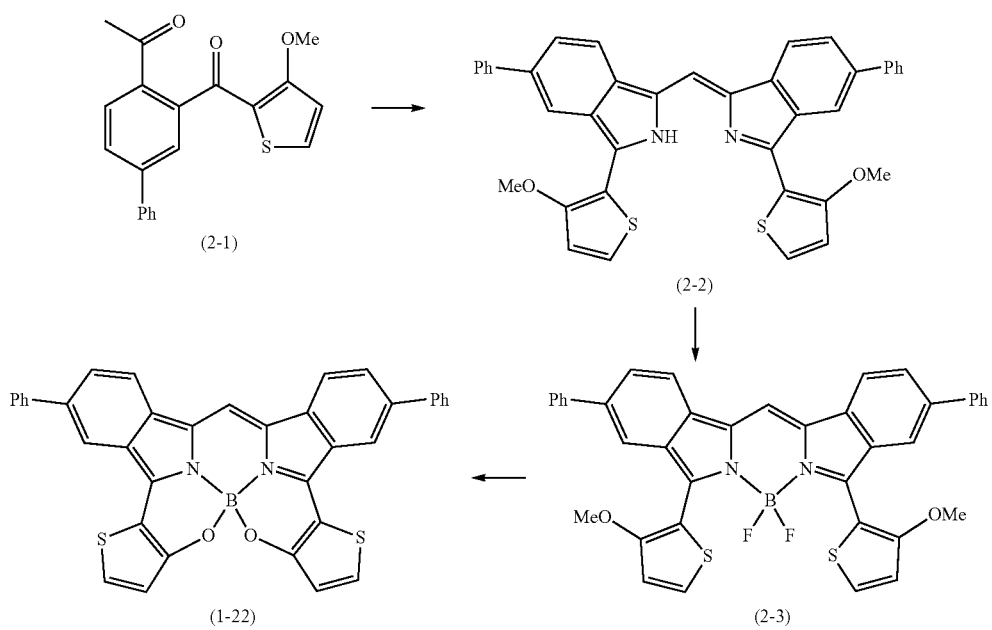

(Step 1) Synthesis of the Intermediate Compound Represented by the Formula (2-2) in the Above Scheme In a flask, (4-acetyl-3-biphenyl)(3-methoxy-2-thienyl) methanone (the compound represented by the formula (2-1) in the above scheme) (68.3 mmol) was dissolved in ethanol (700 mL) and acetic acid (150 mL), and heated to 65° C., then ammonium acetate (400 mmol) and ammonium chloride (70 mmol) were added, and the temperature was raised to 90° C. and stirring was performed for 3 hours. The reaction solution was air-cooled and neutralized with saturated sodium hydrogen carbonate aqueous solution, after that, the resulting solid was collected by filtration to obtain an intermediate compound represented by the formula (2-2) (31.4 mmol, yield 46% by mass).

The measurement results of $^1$H NMR of the intermediate compound represented by the formula (2-2) were as follows.

$^1$H NMR (400 MHz, CDCl$_3$) δ (ppm)=1.55 (1H, bs), 4.04 (6H, s), 7.10 (2H, d), 7.34-7.39 (4H, m), 7.47-7.51 (5H, m), 7.63 (2H, d), 7.72 (4H, d), 7.95 (2H, d), 8.36 (2H, d)

(Step 2) Synthesis of the Compound Represented by the Formula (2-3) in the Above Scheme In a flask, the intermediate compound represented by the formula (2-2) obtained in step 1 (15.3 mmol), toluene (700 mL) and triethylamine (150 mmol) were added and heated to 80° C., then boron trifluoride diethyl ether complex (160 mmol) was added dropwise, and the temperature was raised to 100° C. and stirring was performed overnight. The reaction solution was air-cooled and neutralized with saturated sodium hydrogen carbonate aqueous solution, after that, the resulting solid was collected by filtration to obtain an intermediate compound represented by the formula (2-3) (14.2 mmol, yield: 43% by mass).

The measurement results of $^1$H NMR of the intermediate compound represented by the formula (2-3) were as follows.
$^1$H NMR (400 MHz, CD$_2$Cl$_2$) δ (ppm)=3.85 (6H, s), 6.97 (2H, d), 7.34-7.37 (2H, m), 7.43-7.47 (4H, m), 7.52 (2H, d), 7.62 (4H, d), 7.71 (2H, dd), 7.77 (1H, s), 7.81 (2H, s), 7.95 (2H, d)

(Step 3) Synthesis of the Compound Represented by the Formula (1-22) of the Above Specific Example In a flask, the intermediate compound represented by the formula (2-3) obtained in step 2 (1.5 mmol) and dichloromethane (100 mL) were added and cooled to 0° C. under nitrogen atmosphere. Then, boron tribromide (4.5 mL) was added to the reaction solution, and the reaction system was further stirred for 4 hours while maintaining 0° C. The reaction solution was neutralized with saturated sodium hydrogen carbonate aqueous solution, after that, the resulting solid was collected by filtration to obtain a compound of the present invention represented by the formula (1-22) (1.2 mmol, yield: 80% by mass).

The measurement result of the molecular weight of the compound represented by the formula (1-22) was as follows.
EI-MS (m/z): 600 [M]$^+$ Example 2 (Synthesis of the Compound of the Present Invention)

(Step 4) Synthesis of the Compound of the Present Invention Represented by the Formula (1-39) of the Above Specific Example A compound of the present invention represented by the formula (1-39) (0.65 mmol, yield 43% by mass) was obtained according to steps 1 to 3 of Example 1 except that (4-acetyl-3-biphenyl) (5-(2,1,3-benzothiadiazol-5-yl)-3-methoxy-2-thienyl) methanone was used instead of the compound represented by the formula (2-1).

The measurement result of the molecular weight of the compound represented by the formula (1-39) was as follows.
EI-MS (m/z): 868 [M]

Example 3 (Synthesis of the Compound of the Present Invention)

(Step 5) Synthesis of the Compound of the Present Invention Represented by the Formula (1-48) of the Above Specific Example A compound of the present invention represented by the formula (1-48) (1.3 mmol, yield 84% by mass) was obtained according to steps 1 to 3 of Example 1 except that (3-acetyl-4-biphenyl) (5-(2,1,3-benzothiadiazol-5-yl)-3-methoxy-2- thienyl) methanone was used instead of the compound represented by the formula (2-1).

The measurement result of the molecular weight of the compound represented by the formula (1-48) was as follows.
EI-MS (m/z): 868 [M]

Example 4 (Synthesis of the Compound of the Present Invention)

(Step 6) Synthesis of the Compound of the Present Invention Represented by the Formula (1-83) of the Above Specific Example A compound of the present invention represented by the formula (1-83) (1.1 mmol, yield 72% by mass) was obtained according to steps 1 to 3 of Example 1 except that (2-acetyl-5-fluorophenyl) (5-(2,1,3-benzothiadiazol-5-yl)-3-methoxy-2-thienyl) methanone was used instead of the compound represented by the formula (2-1).

The measurement result of the molecular weight of the compound represented by the formula (1-83) was as follows.
EI-MS (m/z): 752 [M]$^+$ Example 5 (Synthesis of the Compound of the Present Invention)

(Step 7) Synthesis of the Compound of the Present Invention Represented by the Formula (1-84) of the Above Specific Example A compound of the present invention represented by the formula (1-84) (1.1 mmol, yield 70% by mass) was obtained according to steps 1 to 3 of Example 1 except that (2-acetyl-4-phenyl-5-fluorophenyl) (5-(2,1,3-benzothiadiazol-5-yl)-3-methoxy-2-thienyl) methanone was used instead of the compound represented by the formula (2-1).

The measurement result of the molecular weight of the compound represented by the formula (1-84) was as follows.
EI-MS (m/z): 904 [M]$^+$ Example 6 (Synthesis of the Compound of the Present Invention)

(Step 8) Synthesis of the Compound of the Present Invention Represented by the Formula (1-88) of the Above Specific Example A compound of the present invention represented by the formula (1-88) (1.1 mmol, yield 81% by mass) was obtained according to steps 1 to 3 of Example 1 except that (2-acetyl-4-(m-fluorophenyl)-5-fluorophenyl) (5-(2,1,3-benzothiadiazol-5-yl)-3-methoxy-2-thienyl) methanone was used instead of the compound represented by the formula (2-1), The measurement result of the molecular weight of the compound represented by the formula (1-88) was as follows.
EI-MS (m/z): 940 [M]$^+$ Example 7 (Synthesis of the Compound of the Present Invention)

(Step 9) Synthesis of the Compound of the Present Invention Represented by the Formula (1-89) of the Above Specific Example A compound of the present invention represented by the formula (1-89) (0.6 mmol, yield 39% by mass) was obtained according to steps 1 to 3 of Example 1 except that (2-acetyl-4-isobutylphenyl) (5-(2,1,3-benzothiadiazol-5-yl)-3-methoxy-2-thienyl) methanone was used instead of the compound represented by the formula (2-1).

The measurement result of the molecular weight of the compound represented by the formula (1-89) was as follows.
EI-MS (m/z): 828 [M]

Example 8 (Synthesis of the Compound of the Present Invention)

(Step 10) Synthesis of the Compound of the Present Invention Represented by the Formula (1-91) of the Above Specific Example A compound of the present invention represented by the formula (1-91) (1.1 mmol, yield 71% by mass) was obtained according to steps 1 to 3 of Example 1 except that (2-acetyl-5-chlorophenyl)(3-methoxy-2-thienyl) methanone was used instead of the compound represented by the formula (2-1).

The measurement result of the molecular weight of the compound represented by the formula (1-91) was as follows.
EI-MS (m/z): 516 [M]$^+$ Example 9 (Synthesis of the Compound of the Present Invention)

(Step 11) Synthesis of the Compound of the Present Invention Represented by the Formula (1-101) of the Above Specific Example A compound of the present invention represented by the formula (1-101) (1.2 mmol, yield 78% by mass) was obtained according to steps 1 to 3 in Example 1 except that (2-acetyl-5-chlorophenyl) (5-(2,1,3-benzothiadiazol-5-yl)-3-methoxy-2-thienyl) methanone was used instead of the compound represented by the formula (2-1).

The measurement result of the molecular weight of the compound represented by the formula (1-101) was as follows.
EI-MS (m/z): 784 [M]$^+$ Comparative Example 1 (Synthesis of the Comparative Compound)

A comparative compound represented by the following formula (3-1) was obtained according to the method described in Patent Literature 2.

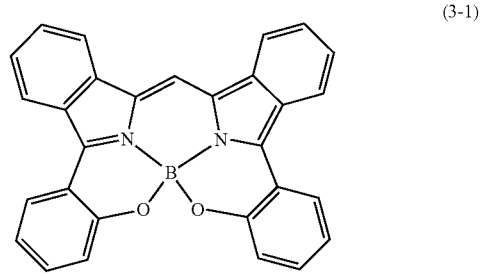

(3-1)

(Measurement of λmax of Absorption Spectrum of Chloroform Solution of the Compound of the Present Invention and the Compound for Comparison)

The Chloroform solutions (concentration $1.0 \times 10^{-5}$ mol/L) of the compounds obtained in Examples 1 to 9 and Comparative Example 1 were prepared, and Table 1 shows the values of λmax determined based on the measurement results of the absorption spectrum.

TABLE 1

Measurement Results of λmax

| Compound formula No. | λmax of Chloroform Solution |
| --- | --- |
| 1-22 | 755 nm |
| 1-39 | 830 nm |
| 1-48 | 845 nm |
| 1-83 | 861 nm |
| 1-84 | 874 nm |
| 1-88 | 869 nm |
| 1-89 | 862 nm |
| 1-91 | 780 nm |
| 1-101 | 858 nm |
| 3-1 | 720 nm |

According to the results of Table 1, it is clear that the compounds of the present invention (the compounds represented by the formulas (1-22), (1-39), (1-48), (1-83), (1-84), (1-88), (1-89), (1-91), and (1-101)) obtained in Examples 1 to 9 have λmax in the longer wavelength region than the compounds for comparison (the compound represented by the formula (3-1)), and can absorb near-infrared light efficiently.

Example 10 (Production and Evaluation of the Organic Thin Film Containing the Compound of the Present Invention)

An organic thin film of the present invention having a film thickness of 20 nm was obtained on a glass substrate by a resistance heating vacuum vapor deposition method using the compound represented by the formula (1-48) obtained in Example 3 which was previously purified by the sublimation. The absorption spectrum of the obtained organic thin film was measured, and the results are shown in FIG. 3. The λmax of the organic thin film was 931 nm.

Example 11 (Production and Evaluation of the Organic Thin Film Containing the Compound of the Present Invention)

An organic thin film of the present invention having a film thickness of 90 nm was obtained on a glass substrate by a resistance heating vacuum vapor deposition method using the compound represented by the formula (1-83) obtained in Example 4 which was previously purified by the sublimation. The absorption spectrum of the obtained organic thin film was measured, and the results are shown in FIG. 4. The λmax of the organic thin film was 929 nm.

Example 12 (Production and Evaluation of the Organic Thin Film Containing the Compound of the Present Invention)

An organic thin film of the present invention having a film thickness of 75 nm was obtained on a glass substrate by a resistance heating vacuum vapor deposition method using the compound represented by the formula (1-84) obtained in Example 5 which was previously purified by the sublimation. The absorption spectrum of the obtained organic thin film was measured, and the results are shown in FIG. 5. The λmax of the organic thin film was 938 nm.

Example 13 (Production and Evaluation of the Organic Thin Film Containing the Compound of the Present Invention)

An organic thin film of the present invention having a film thickness of 75 nm was obtained on a glass substrate by a resistance heating vacuum vapor deposition method using the compound represented by the formula (1-88) obtained in Example 6 which was previously purified by the sublimation. The absorption spectrum of the obtained organic thin film was measured, and the results are shown in FIG. 6. The λmax of the organic thin film was 935 nm.

Example 14 (Production and Evaluation of the Organic Thin Film Containing the Compound of the Present Invention)

An organic thin film of the present invention having a film thickness of 80 nm was obtained on a glass substrate by a resistance heating vacuum vapor deposition method using the compound represented by the formula (1-91) obtained in Example 8 which was previously purified by the sublimation. The absorption spectrum of the obtained organic thin film was measured, and the results are shown in FIG. 7. The λmax of the organic thin film was 807 nm.

Comparative Example 2 (Production and Evaluation of the Organic Thin Film Containing the Compound for Comparison)

The absorption spectrum of the organic thin film for comparison was measured according to Example 10 except that the compound represented by the formula (3-1) was used instead of the compounds of the present invention and the results are shown in FIG. 8.

The results of FIGS. 3 to 8 show that the λmax of the organic thin film for comparison containing the compound for comparison represented by the formula (3-1) was 760 nm, whereas the λmax of the organic thin film of the Example containing the compound of the present invention was longer than 807 nm. The organic thin films containing the compounds of the present invention have the larger absorption band in the near-infrared region of 700 nm or more, and clearly absorb infrared light efficiently.

Example 15 (Production and Evaluation of the Organic Photoelectric Conversion Element Containing the Organic Thin Film of the Present Invention)

An organic thin film having a thickness of 90 nm was formed on a transparent conductive ITO glass (GEOMATEC Co., Ltd., ITO film thickness 150 nm) washed in advance by the resistance heating vacuum deposition of the compound represented by the formula (1-83). Then, by forming an electrode having a thickness of 100 nm on the organic thin film obtained by the resistance heating vacuum deposition of aluminum, the organic photoelectric conversion of the present invention was produced. The photocurrent responsiveness was measured when a voltage of 2.0 V was applied under the photoirradiation at 300 to 1100 nm using ITO and aluminum as electrodes. The results are shown in FIG. 9.

Example 16 (Production and Evaluation of the Organic Photoelectric Conversion Element Containing the Organic Thin Film of the Present Invention)

An organic thin film having a thickness of 75 nm was formed on the transparent conductive ITO glass (GEOMATEC Co., Ltd., ITO film thickness 150 nm) washed in advance by the resistance heating vacuum vapor deposition of the compound represented by the formula (1-84). Then, by forming an electrode having a thickness of 100 nm on the organic thin film obtained by the resistance heating vacuum vapor deposition of aluminum, an organic photoelectric conversion element of the present invention was produced. The photocurrent responsiveness was measured when a voltage of 1.0 V was applied under the photoirradiation at 300 to 1100 nm using ITO and aluminum as electrodes. The results are shown in FIG. 10.

Example 17 (Production and Evaluation of the Organic Photoelectric Conversion Element Containing the Organic Thin Film of the Present Invention)

An organic thin film having a thickness of 75 nm was formed on the transparent conductive ITO glass (GEO-MATEC Co., Ltd., ITO film thickness 150 nm) washed in advance by the resistance heating vacuum vapor deposition of the compound represented by the formula (1-88). Then, by forming an electrode having a thickness of 100 nm on the organic thin film obtained by the resistance heating vacuum vapor deposition of aluminum, an organic photoelectric conversion element of the present invention was produced. The photocurrent responsiveness was measured when a voltage of 1.0 V was applied under the photoirradiation at 300 to 1100 nm using ITO and aluminum as electrodes. The results are shown in FIG. 11.

Example 18 (Production and Evaluation of the Organic Photoelectric Conversion Element Containing the Organic Thin Film of the Present Invention)

An organic thin film having a thickness of 80 nm was formed on the transparent conductive ITO glass (GEO-MATEC Co., Ltd., ITO film thickness 150 nm) washed in advance by the resistance heating vacuum vapor deposition The compound represented by the formula (1-91). Then, by forming an electrode having a thickness of 100 nm on the organic thin film obtained by the resistance heating vacuum vapor deposition of aluminum, an organic photoelectric conversion element of the present invention was produced. The photocurrent responsiveness was measured when a voltage of 0.01 V was applied under the photoirradiation at 300 to 1100 nm using ITO and aluminum as electrodes. The results are shown in FIG. 12.

Comparative Example 3 (Production and Evaluation of the Organic Photoelectric Conversion Element Containing the Organic Thin Film for Comparison)

An organic photoelectric conversion element for comparison was produced according to Example 15 except that the compound represented by the formula (3-1) was used instead of the compound represented by the formula (1-83), and the photocurrent responsiveness was measured. The photocurrent responsiveness was measured when a voltage of 0.05 V was applied under the photoirradiation at 300 to 1100 nm using ITO and aluminum as electrodes. The results are shown in FIG. 13.

According to the results of FIGS. 9 to 13, it is clear that the organic photoelectric conversion element containing the organic thin film of the present invention has the higher photocurrent responsiveness in the near-infrared region than the organic photoelectric conversion element for comparison and also has the higher photoelectric conversion efficiency.

Example 19 (Evaluation of Retention Rate of Photocurrent Density of the Organic Photoelectric Conversion Element Containing the Organic Thin Film of the Present Invention)

The photocurrent density (A/cm$^2$) was measured under the same conditions of the photoirradiation and the applied voltage as Examples 15 to 18 using the organic photoelectric conversion element of the present invention obtained in Examples 15 to 18. when the photocurrent density at 750 nm is regarded as 100, the retention rate of the photocurrent density at 800, 850, and 900 nm was calculated, and the results are shown in Table 2.

Comparative Example 4 (Evaluation of Retention Rate of Photocurrent Density of the Organic Photoelectric Conversion Element Containing the Organic Thin Film for Comparison)

The photocurrent density (A/cm$^2$) was measured under the same conditions of the photoirradiation and the applied voltage as Examples 15 using the organic photoelectric conversion element for comparison obtained in Comparative Example 3, when the photocurrent density at 750 nm is regarded as 100, the retention rate of the photocurrent density at 800, 850, and 900 nm was calculated, and the results are shown in Table 2.

TABLE 2

Retention rate of photocurrent density in a wavelength of 750 to 950 nm

| | Retention rate of photocurrent density | | | | |
|---|---|---|---|---|---|
| Wave-length | Example 19 (Example 15) | Example 19 (Example 16) | Example 19 (Example 17) | Example 19 (Example 18) | Comparative Example 4 (Comparative Example 3) |
| 750 nm | 100% | 100% | 100% | 100% | 100% |
| 800 nm | 125% | 136% | 141% | 82% | 87% |
| 850 nm | 141% | 167% | 173% | 82% | 19% |
| 900 nm | 149% | 193% | 190% | 21% | 1% |
| 950 nm | 168% | 264% | 241% | 0% | 0% |

According to the results of Table 2, the photocurrent density at 850 nm was lowered to about 20% with respect to the photocurrent density at 750 nm in the organic photoelectric conversion element of Comparative Example 4, whereas the photocurrent density at 850 nm was maintained at about 80% with respect to the photocurrent density at 750 nm in the organic photoelectric conversion element of Example 18 of the present invention. Moreover, the organic photoelectric conversion elements of Examples 15 to 17 have a photoelectric conversion wavelength maximum at 950 nm. According to the above results, it is clear that the organic photoelectric conversion element containing the organic thin film of the present invention is excellent in the photoelectric conversion efficiency in the near-infrared region.

INDUSTRIAL APPLICABILITY OF THE INVENTION

The compound of the present invention has all of the ease of synthesis, the absorption properties in the near-infrared region and the vapor depositable properties, and is very useful as the organic electronics device material operating in the near-infrared region.

REFERENCE NUMBER LIST (FIG. 1)
1 Insulation part
2 Upper electrode film
3 Electron block layer
4 Photoelectric conversion layer
5 Hole block layer
6 Lower electrode film
7 Insulation substrate or Another organic photoelectric conversion element (FIG. 2)
1 Substrate
2 Positive electrode
3 Hole injection layer
4 Hole transport layer
5 Luminescent layer
6 Electron transport layer
7 Negative electrode

The invention claimed is:

1. A compound of the following formula;

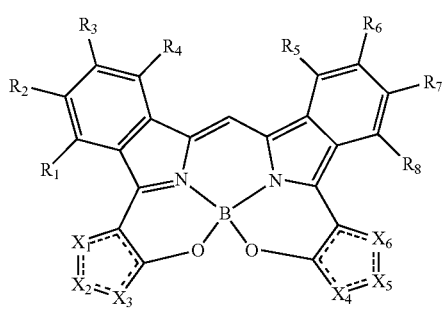

(1)

wherein in the formula, $R_1$ to $R_8$ are each a hydrogen atom, aliphatic hydrocarbon group, alkylthio group, aromatic group, heterocyclic group, a halogen atom, hydroxyl group, mercapto group, nitro group, substituted amino group, unsubstituted amino group, cyano group, sulfo group, or acyl group, wherein at least one of $R_1$ to $R_4$ is the group or the atom other than the hydrogen atom, and at least one of $R_5$ to $R_8$ is the group or the atom other than the hydrogen atom, wherein one of $X_1$ to $X_3$ is a sulfur atom, and the remaining two of $X_1$ to $X_3$ are carbon atoms having one $R_0$, wherein one of $X_4$ to $X_6$ is a sulfur atom, and the remaining two of $X_4$ to $X_6$ are carbon atoms having one $R_0$, wherein $R_0$ is each independently a hydrogen atom, aliphatic hydrocarbon group, alkoxy group, alkylthio group, aromatic group, heterocyclic group, a halogen atom, hydroxyl group, mercapto group, nitro group, substituted amino group, unsubstituted amino group, cyano group, sulfo group, or acyl group, and wherein when $X_1$ and $X_2$ are each $R_0C$, $X_2$ and $X_3$ are each $R_0C$, $X_4$ and $X_5$ are each $R_0C$, or $X_5$ and $X_6$ are each $R_0C$, the adjacent $R_0$s may be bonded to each other to form a cyclic structure.

2. The compound according to claim 1 wherein the compound has the following formula;

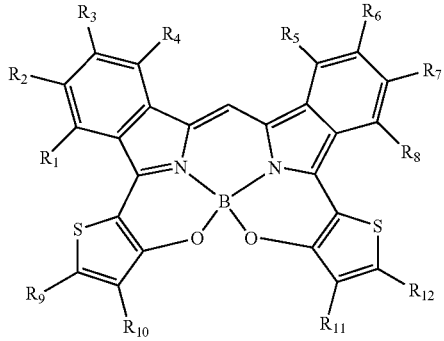

(2)

wherein in the formula, $R_1$ to $R_8$ are each the same group or atom as $R_1$ to $R_8$ in the formula (1) of claim 1, wherein $R_9$ to $R_{12}$ are each independently a hydrogen atom, aliphatic hydrocarbon group, alkoxy group, alkylthio group, aromatic group, heterocyclic group, a halogen atom, hydroxyl group, mercapto group, nitro group, substituted amino group, unsubstituted amino group, cyano group, sulfo group, or acyl group, and wherein $R_9$ and $R_{10}$ may be bonded to each other to form a cyclic structure, and $R_{11}$ and $R_{12}$ may be bonded to each other to form a cyclic structure.

3. The compound according to claim 1,
wherein at least one of $R_1$ to $R_4$ is aliphatic hydrocarbon group, aromatic group, heterocyclic group or a halogen atom, and at least one of $R_5$ to $R_8$ is aliphatic hydrocarbon group, aromatic group, heterocyclic group or a halogen atom.

4. The compound according to claim 3,
wherein at least one of $R_1$ to $R_4$ is a halogen atom and at least one of $R_5$ to $R_8$ is a halogen atom.

5. The compound according to claim 4,
wherein at least one of $R_1$ to $R_4$ is aliphatic hydrocarbon group, aromatic group or heterocyclic group and at least one of $R_5$ to $R_8$ is aliphatic hydrocarbon group, aromatic group or heterocyclic group.

6. The compound according to claim 1,
wherein $R_1$ and $R_8$ are the same group or atom, $R_2$ and $R_7$ are the same group or atom, $R_3$ and $R_6$ are the same group or atom, and $R_4$ and $R_5$ are the same group or atom.

7. The compound according to claim 2,
wherein at least one of $R_9$ and $R_{10}$ is aromatic group, heterocyclic group or a halogen atom and at least one of $R_{11}$ and $R_{12}$ is aromatic group, heterocyclic group or a halogen atom.

8. A near-infrared light absorbing material comprising the compound according to claim 1.

9. An organic thin film comprising the near-infrared light absorbing material according to claim 8.

10. An organic electronics device comprising the organic thin film according to claim 9.

11. An organic photoelectric conversion element comprising the organic thin film according to claim 9.

* * * * *

UNITED STATES PATENT AND TRADEMARK OFFICE
CERTIFICATE OF CORRECTION

PATENT NO. : 10,749,116 B1
APPLICATION NO. : 16/637064
DATED : August 18, 2020
INVENTOR(S) : Tatsuya Aotake et al.

Page 1 of 1

It is certified that error appears in the above-identified patent and that said Letters Patent is hereby corrected as shown below:

On the Title Page

Item (57), ABSTRACT, Line 11, delete "bounded" and insert -- bonded --

In the Claims

Column 67, Line 42, Claim 1, after "hydrocarbon group," insert -- alkoxy group, --

Signed and Sealed this
Fifth Day of January, 2021

Andrei Iancu
*Director of the United States Patent and Trademark Office*